(12) United States Patent
Lee et al.

(10) Patent No.: US 11,489,083 B2
(45) Date of Patent: Nov. 1, 2022

(54) SOLAR CELL PANEL

(71) Applicant: LG ELECTRONICS INC., Seoul (KR)

(72) Inventors: Hyunho Lee, Seoul (KR); Donghae Oh, Seoul (KR); Jaewon Chang, Seoul (KR); Jinsung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 745 days.

(21) Appl. No.: 16/284,725

(22) Filed: Feb. 25, 2019

(65) Prior Publication Data

US 2019/0280140 A1    Sep. 12, 2019

(30) Foreign Application Priority Data

Mar. 6, 2018  (KR) .................. 10-2018-0026337
Mar. 12, 2018 (KR) .................. 10-2018-0028739
Apr. 16, 2018 (KR) .................. 10-2018-0043978

(51) Int. Cl.
*H01L 31/05* (2014.01)
*H01L 31/0475* (2014.01)
*H01L 31/0224* (2006.01)

(52) U.S. Cl.
CPC .. *H01L 31/0508* (2013.01); *H01L 31/022425* (2013.01); *H01L 31/0475* (2014.12)

(58) Field of Classification Search
CPC ............ H01L 31/0508; H01L 31/0475; H01L 31/022425
See application file for complete search history.

(56) References Cited

U.S. PATENT DOCUMENTS

| | | | |
|---|---|---|---|
| 5,004,903 A * | 4/1991 | Kitamura .......... | H01L 27/14643 250/208.1 |
| 5,998,729 A | 12/1999 | Shiomi et al. | |
| 2007/0107772 A1 | 5/2007 | Meck et al. | |
| 2010/0108119 A1 | 5/2010 | Gee et al. | |
| 2015/0349145 A1* | 12/2015 | Morad .................. | H02S 30/00 136/261 |
| 2016/0087579 A1* | 3/2016 | Moslehi .............. | H01L 31/0201 136/251 |
| 2017/0324269 A1* | 11/2017 | Lee ....................... | H02S 40/34 |

FOREIGN PATENT DOCUMENTS

WO    WO 2011/049632 A1    4/2011

OTHER PUBLICATIONS

"ESD Failure Analysis of PV Module Diodes and TLP Test Methods", Huang et al.,, [online], [retrieved on Dec. 15, 2021], Retrieved from the Internet:<URL: https://incompliancemag.com/article/esd-failure-analysis-of-pv-module-diodes-and-tlp-test-methods/>, pp. 1-23. (Year: 2016).*

(Continued)

*Primary Examiner* — Tae-Sik Kang
(74) *Attorney, Agent, or Firm* — Birch, Stewart, Kolasch & Birch, LLP

(57) ABSTRACT

A solar cell panel can include a plurality of solar cells; and a diode member connected to the plurality of solar cells, the diode member being formed of a solar cell unit disposed within the solar cell panel under at least a portion of one of the plurality of solar cells at a non-light-incident region.

14 Claims, 25 Drawing Sheets

(56) References Cited

OTHER PUBLICATIONS

Taguchi et al., "24.7% Record Efficiency HIT Solar Cell on Thin Silicon Wafer", IEEE Journal of Photovoltaics, vol. 4, No. 1, Jan. 2014. (Year: 2014).*

Klasen et al., "Shingled Cell Interconnection: Aiming for a New Generation of Bifacial PV-Modules," 7th Workshop on Metallization and Interconnection, Konstanz, Germany, Oct. 24, 2017, pp. 2-18 (37 total pages).

* cited by examiner

FIG. 10
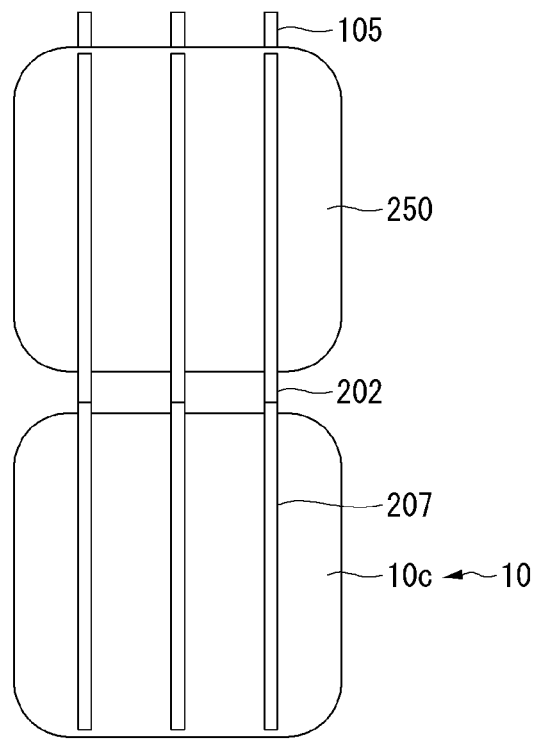
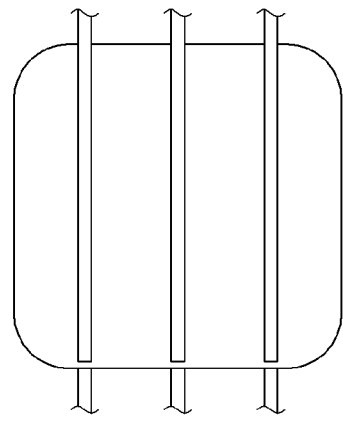

ically conversion, and is positioned inside of a junction box, and thus, the structure is complicated and a manufacturing cost of a solar cell module including the solar cell panel is high. In this instance, in another related art solar cell panel, solar cells connected to each other are spaced apart from each other and a structure for bypassing current is positioned therebetween. In this structure, solar cells are spaced apart from each other in an active area where photoelectric conversion is to be generated and a structure for bypassing current is provided between the solar cells. As a result, efficiency of a solar cell panel may be deteriorated.

SOLAR CELL PANEL

CROSS-REFERENCE TO RELATED APPLICATION

This application claims priority to and the benefit of Korean Patent Applications No. 10-2018-0026337 filed on Mar. 6, 2018, No. 10-2018-0028739 filed on Mar. 12, 2018 and No. 10-2018-0043978 filed on Apr. 16, 2018 in the Korean Intellectual Property Office, the entire contents of all these applications are incorporated herein by reference.

BACKGROUND OF THE INVENTION

Field of the Invention

Embodiments of the invention relate to a solar cell panel, and, more particularly, to a solar cell panel having an improved structure.

Description of the Related Art

A plurality of solar cells are connected in series or in parallel by interconnectors, and are manufactured in a form of a solar cell panel by a packaging process for protecting a plurality of solar cells.

When a plurality of solar cell strings are connected in parallel and some of solar cells do not operate normally due to defects or shading, a reverse voltage is generated and current to flow in a forward direction is reversed, and then, a solar cell panel may be damaged or total output of a solar cell panel may be lowered. In order to prevent this, a block diode is installed at a solar cell panel to block generation of reverse voltage when a plurality of solar cell strings are connected in parallel. In the related art solar cell panel, the block diode is formed of a semiconductor device having a chip type, which has a totally different structure from a solar cell, and thus, a connection structure of a solar cell and the block diode is complicated and a manufacturing cost of a solar cell panel is high.

Alternatively, when a plurality of solar cell strings where a plurality of solar cell are connected in series are included in a solar cell panel and some of solar cells do not operate normally due to defects or shading, current may be concentrated at some the solar cells and thus a problem such as a hot spot may occur. In order to prevent this, a bypass diode is installed at a solar cell module including a solar cell panel to bypass current to be expected to flow through a solar cell string which does not operate normally due to defect or shading or the like. In the related art solar cell panel, the bypass diode is formed of a semiconductor device having a chip type, which has a totally different structure from a solar cell, and is positioned inside of a junction box, and thus, the structure is complicated and a manufacturing cost of a solar cell module including the solar cell panel is high. In this instance, in another related art solar cell panel, solar cells connected to each other are spaced apart from each other and a structure for bypassing current is positioned therebetween. In this structure, solar cells are spaced apart from each other in an active area where photoelectric conversion is to be generated and a structure for bypassing current is provided between the solar cells. As a result, efficiency of a solar cell panel may be deteriorated.

SUMMARY OF THE INVENTION

Therefore, embodiments of the invention have been made in view of the above problems, and embodiments of the invention are to provide a solar cell panel having a simple structure and capable of reducing a manufacturing cost.

More particularly, embodiments of the invention are to provide a solar cell panel including a diode member having a simple connection structure with a solar cell, a low manufacturing cost, and excellent properties. For example, when a bypass diode is provided as a diode member, the bypass diode is positioned in a solar cell panel, not inside a junction box, thereby maximally simplifying a structure.

Meanwhile, embodiments of the invention are to provide a solar cell panel having high efficiency by a simple structure.

A solar cell panel according to an embodiment of the invention includes a plurality of solar cells; and a diode member connected to the plurality of solar cells. The diode member is formed of a solar cell unit positioned at a non-light-incident region.

The plurality of solar cells may be connected in series to form a solar cell string, and the diode member may include a block diode connected to the solar cell string.

The solar cell panel may include a plurality of solar cell strings connected in parallel. The block diode may include a plurality of block diodes positioned at one end of the plurality of solar cell strings. The block diode may be connected in series to an end solar cell positioned at the one end of the plurality of solar cells forming the solar cell string.

At least one of the plurality of solar cells may include a semiconductor substrate, a first conductive region having a first conductivity type, and a second conductive region having a second conductivity type opposite to the first conductivity type. The block diode may include a sub-semiconductor substrate, a first sub-conductive region having the first conductivity type, and a second sub-conductive region having the second conductivity type. The first conductive region and the first sub-conductive region may be electrically connected to each other, and the second conductive region and the second sub-conductive region may be electrically connected to each other.

An end solar cell positioned at one end of the plurality of solar cells forming the solar cell string and the block diode may be spaced apart from each other, and the end solar cell and the block diode may be connected to each other by a connecting member.

The first sub-conductive region may be positioned on or at a first surface of the block diode that is the same surface as a first surface of the end solar cell where the first conductive region is positioned. The second sub-conductive region may be positioned on or at a second surface of the block diode that is the same surface as a second surface of the end solar cell where the second conductive region is positioned. The connecting member may include a first connecting member for connecting the first conductive region and the first sub-conductive region on the first surfaces, and a second connecting member for connecting the second conductive region and the second sub-conductive region on the second surfaces.

The plurality of solar cells may form a solar cell string, and the plurality of solar cells may form a plurality of solar cell groups. The diode member may include a bypass diode connected to at least one of the plurality of solar cell groups.

The plurality of solar cell groups may include a first solar cell group and a second solar cell group connected in series to the first solar cell group. The bypass diode may include a first bypass diode connected in parallel to the first solar cell group and a second bypass diode connected in parallel to the second solar cell group.

An interconnector member electrically connected to the plurality of solar cell groups may be further included, and the bypass diode may be connected to the interconnector member through a connecting member.

At least one of the plurality of solar cells may include a semiconductor substrate, a first conductive region having a first conductivity type, and a second conductive region having a second conductivity type opposite to the first conductivity type. The bypass diode may include a sub-semiconductor substrate, a first sub-conductive region having the first conductivity type, and a second sub-conductive region having the second conductivity type. The interconnector member may include a first interconnector member connected to the first conductive region at one side of one of the plurality of solar cell groups and a second interconnector member connected to the second conductive region at the other side of the one of the plurality of the solar cell groups. The connecting member may include a first connecting member for electrically connecting the first sub-conductive region to the first interconnector member, and a second connecting member for electrically connecting the second sub-conductive region to the second interconnector member.

At least one of the plurality of solar cell groups may include a plurality of solar cell strings connected in parallel to each other, and at least one of the plurality of solar cell strings may include a plurality of solar cells connected in series to each other.

At least one of the plurality of solar cells and the diode member may have the same lamination structure, or the block diode may have an area the same as or smaller than that of at least one of the plurality of solar cells.

The plurality of solar cells and the diode member may be connected to each other by a connecting member, and the diode member and at least a part of the connecting member are positioned on a back surface of the plurality of solar cells.

The plurality of solar cells may include a first solar cell and a second solar cell adjacent to each other and each having a long axis and a short axis. The first solar cell and the second solar cell may have an overlap area where the first and second solar cells overlap each other, and an adhesive member may be positioned between the first and second solar cells at the overlap area to connect the first and second solar cells. Alternatively, the plurality of solar cells may include two solar cells adjacent to each other, and the two solar cells may be connected to each other by a ribbon or a wiring member extending from a first surface of one solar cell of the two solar cells to a second surface of the other solar cell of the two solar cells opposite to the first surface.

According to the embodiment, a manufacturing cost corresponding to a diode member can be reduced by using a solar cell unit as the diode member, and a connection structure between solar cells may be used as a connection structure between the solar cell and the bypass diode as it is and thus a connection structure can be simplified. As an example, the diode member can be installed or positioned in the solar cell panel, not in a junction box, which is conventionally positioned outside of the solar cell panel, and thus, a structure can be maximally simplified. Thus, a manufacturing cost of the solar cell panel can be reduced and a structure can be simplified by using the diode member having a simple connection structure with the solar cell, low manufacturing cost, and excellent properties.

A solar cell panel according to another embodiment of the invention includes a solar cell string including a plurality of solar cells, and an intermediate interconnector member connected to the plurality of solar cells. The plurality of solar cells include a first solar cell and a second solar cell having a long axis and a short axis, respectively, and connected to each other to have an overlap area where the first solar cell and the second solar cell overlap each other. The intermediate interconnector member includes an overlapped portion positioned between the first solar cell and the second solar cell at the overlap area and an outer portion extending from the overlapped portion and positioned outside the overlap area.

The solar cell string may include a plurality of solar cell strings connected in parallel to each other, and the intermediate interconnector member may connect the plurality of solar cell strings at an intermediate region of the plurality of solar cell strings.

The intermediate interconnector member may include a first member and a second member. The first member may correspond to the solar cell string, and the first member may include the overlapped portion and the outer portion extending from the overlapped portion and overlapping the solar cell string at a back surface of the solar cell string. The second member may be connected to the outer portion of the first member and extend to an outside of the solar cell string in a direction crossing the solar cell string.

The intermediate interconnector member may include the overlapped portion, and the outer portion extending from the overlapped portion and extending to an outside of the solar cell string.

A first attaching member and a second attaching member may be further included. The first attaching member may be positioned on one surface of the overlapped portion of the intermediate interconnector member between the one surface of the overlapped portion of the intermediate interconnector member and a first electrode of the first solar cell. The second attaching member may be positioned on the other surface of the overlapped portion of the intermediate interconnector member between the other surface of the overlapped portion of the intermediate interconnector member and a second electrode of the second solar cell.

At least a part of the outer portion of the intermediate interconnector member may overlap a back surface of the solar cell string. The solar cell panel may further include an insulating layer between the at least a part of the outer portion of the intermediate interconnector member and the back surface of the solar cell string overlapping each other.

According to the embodiment, even when an intermediate interconnector member is provided to form a bypass path, there is no space between solar cells or solar cell groups in an extending direction of a solar cell string. Accordingly, even when the intermediate interconnector member is provided, an area contributing to photoelectric conversion can be sufficiently secured to prevent output of a solar cell panel from being deteriorated.

BRIEF DESCRIPTION OF THE DRAWINGS

FIG. 10 is a plan view schematically showing a solar cell string and a block diode connected thereto, which are included in a solar cell panel according to yet another embodiment.

DETAILED DESCRIPTION OF THE EMBODIMENTS

Figure 1:
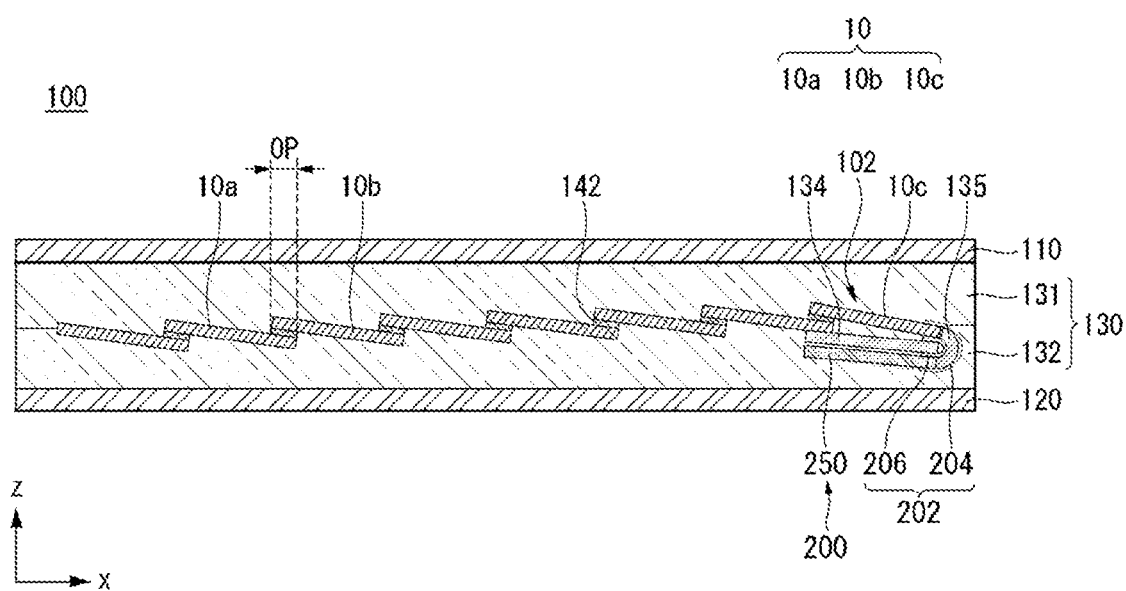
FIG. 1 is a schematic cross-sectional view showing a solar cell panel according to an embodiment of the invention.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also therebetween. Accordingly, when an element such as a layer, film, region, or plate is disposed "directly on" another element, this means that there is no intervening element between the elements.

Hereinafter, a solar cell panel according to an embodiment of the invention will be described in detail with reference to the accompanying drawings.

FIG. 1 is a schematic cross-sectional view showing a solar cell panel 100 according to an embodiment of the invention. For clarity and simplicity, an interconnector member 104 (see FIG. 2) is not shown in FIG. 1.

Referring to FIG. 1, a solar cell panel 100 according to an embodiment includes a plurality of solar cells 10, and a diode member 200 connected to the solar cells 10. The diode member 200 is positioned at a non-light-incident region and is formed of a solar cell unit. In the embodiment, the plurality of solar cells 10 may form a solar cell string 102 and the diode member 200 may be formed of a block diode 250 connected to the solar cell string 102. The solar cell panel 100 may include a plurality of solar cell strings 102 connected in parallel to each other, and the block diode 250 may be positioned at one end of at least one of a plurality of solar cell strings 102 (e.g., a plurality of solar cell string 102), respectively. The solar cell panel 100 may include an interconnector member 104, a sealing member 130, a first cover member 110, and a second cover member 120. The interconnector member 104 connects a solar cell string 102 to an outside (e.g., an external circuit) or another solar cell string 102. The sealing member 130 surrounds and seals the solar cells 10 and the interconnector member 104. The first cover member 110 is positioned at one surface of the solar cell 10 on the sealing member 130, and the second cover member 120 is positioned at the other surface of the solar cell 10 on the sealing member 130. This will be explained in more detail.

The first cover member 110 is disposed on the sealing member 130 (for example, a first sealing material 131) to form one surface (for example, a front surface) of the solar cell panel 100, and the second cover member 120 is disposed on the sealing member 130 (for example, a second sealing member 132) to form the other surface (for example, a back surface) of the solar cell panel 100. Each of the first cover member 110 and the second cover member 120 may be formed of an insulating material capable of protecting the solar cell 10 from external shock, moisture, ultraviolet rays, or the like. The first cover member 110 may be formed of a light-transmitting material that can transmit light, and the second cover member 120 may be formed of a sheet formed of a light-transmitting material, a non-light-transmitting material, a reflective material, or the like. For example, the first cover member 110 may be formed of a glass substrate having excellent durability and excellent insulation properties, and the second cover member 120 may be formed of a film or a sheet. The second cover member 120 may have a TPT (Tedlar/PET/Tedlar) type or a polyvinylidene fluoride (PVD) resin layer formed on at least one surface of a base film (e.g., polyethylene terephthalate PVDF).

The sealing member 130 may include a first sealing member 131 positioned on a front surface of the solar cell 10 and a second sealing member 132 positioned on a back surface of the solar cell 10. The first sealing member 131 and the second sealing member 132 prevent moisture and oxygen from entering and chemically bind elements of the solar cell panel 100. The first and second sealing members 131 and 132 may be formed of an insulating material having light-transmittance and adhesiveness. For example, an ethylene-vinyl acetate copolymer resin (EVA), a polyvinyl butyral, a silicone resin, an ester-based resin, an olefin-based resin, or the like may be used for the first sealing member 131 and the second sealing member 132. The second cover member 120, the second sealing member 132, the plurality of solar cells 10 and the like, the first sealing member 131, and the first cover member 10 may be integrated to form the solar cell panel 100 by a lamination process using the first and second sealing members 131 and 132.

However, embodiments of the invention are not limited thereto. Accordingly, the first and second sealing members 131 and 132, the first cover member 110, or the second cover member 120 may include any of various materials other than those described above, and may have any of various shapes. For example, the first cover member 110 or the second cover member 120 may have any of various shapes, types, or forms (e.g., a substrate, a film, a sheet, etc.) or any of various materials.

The solar cell string 102 and the solar cells 10 included therein, the block diode 250, and the like included in the solar cell panel 100 according to the embodiment will be described in detail with reference to FIGS. 2 to 4, together with FIG. 1.

Figure 2:
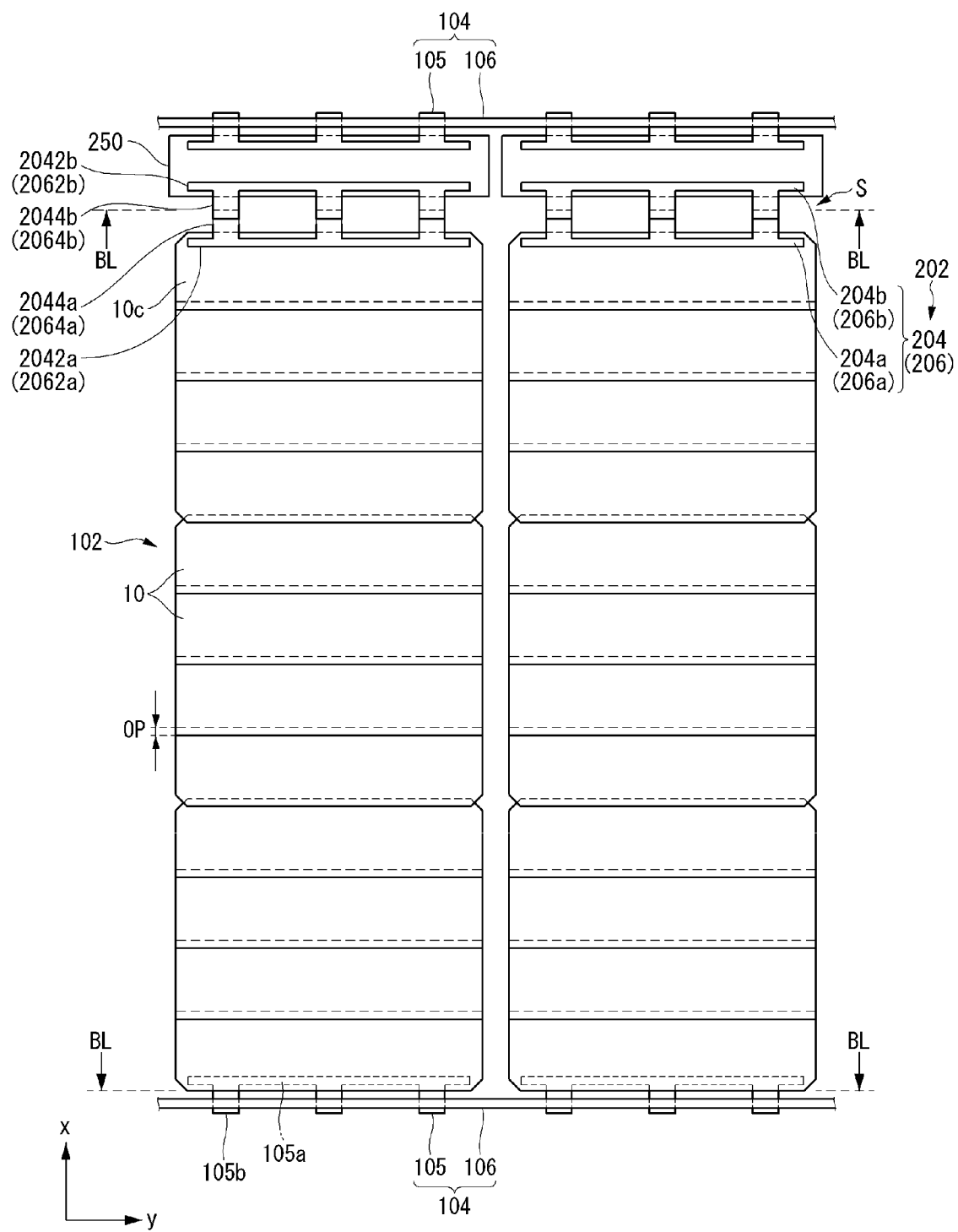
FIG. 2 is a developed view schematically showing a plurality of solar cell strings and block diodes connected thereto, and interconnector members connected thereto, which are included in the solar cell panel shown in FIG. 1.

FIG. 2 is a developed view schematically showing a plurality of solar cell strings 102 and block diodes 250 connected thereto, and interconnector members 104 connected thereto, which are included in the solar cell panel 100 shown in FIG. 1. FIG. 3 is a cross-sectional view schematically showing two solar cells 10 included in the solar cell string 102 and connected to each other by an adhesive member 142 and a block diode 250 connected to the solar cell string 102, which are shown in FIG. 2, as an unfolded state. FIG. 4 is a front view and a back plan view showing an example of a solar cell 10 included in the solar cell panel 100 shown in FIG. 1. In FIG. 2, a first electrode 42, a second electrode 44, and an adhesive member 142 are not shown for clarity and simplicity. In FIG. 4, a front plan view of a front surface of a first solar cell 10a is shown at a left side of FIG. 4 and a back plan view of a back surface of a second solar cell 10b is shown at a right side of FIG. 4.

Figure 3:
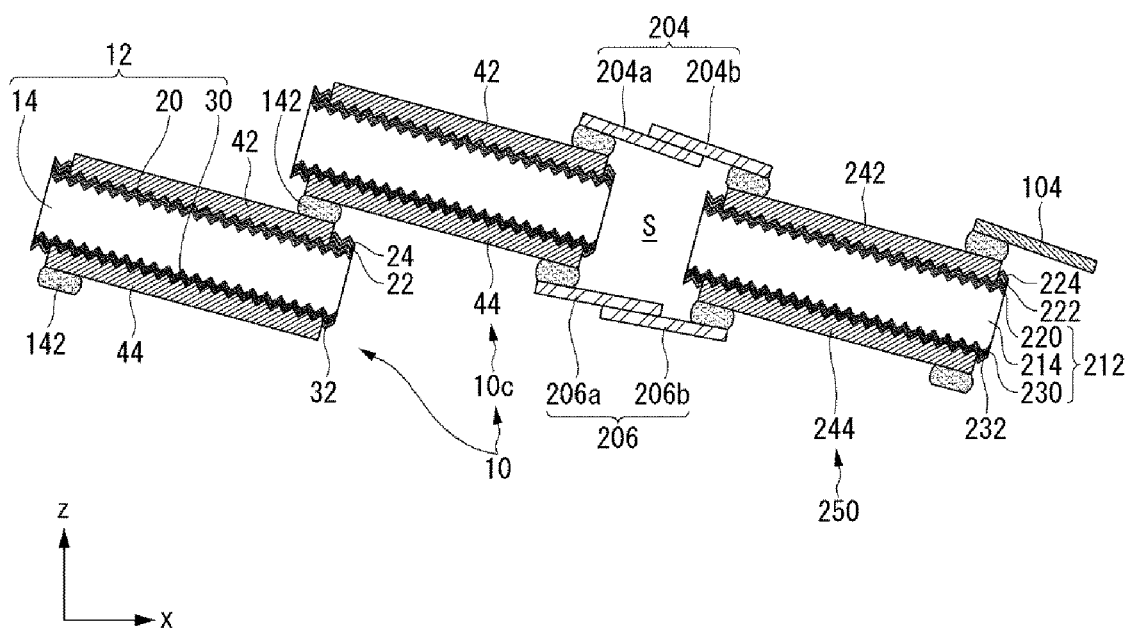
FIG. 3 is a cross-sectional view schematically showing two solar cells included in the solar cell string and connected to each other by an adhesive member and a block diode connected to the solar cell string, which are shown in FIG. 2, as an unfolded state.
Figure 4:
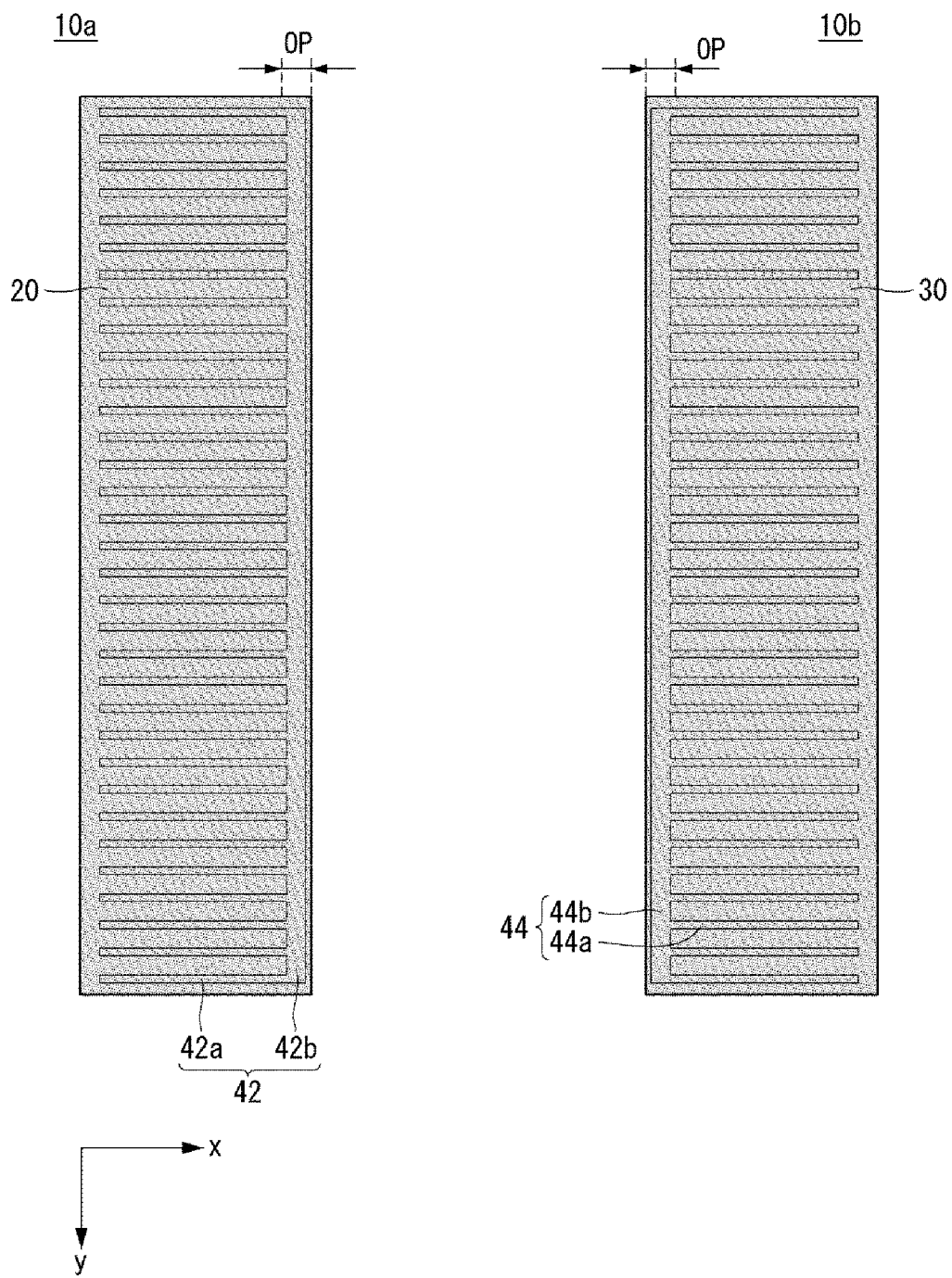
FIG. 4 is a front view and a back plan view showing an example of a solar cell included in the solar cell panel shown in FIG. 1.

Referring to FIGS. 2 to 4, in the embodiment, the solar cell 10 may have a long axis (a major axis) and a short axis (a minor axis) by cutting a mother solar cell. That is, a mother solar cell is cut to manufacture a plurality of solar cells 10 each having a long axis and a short axis, and the solar cell 10 having the long axis and the short axis is used as a unit solar cell. When the solar cell panel 100 is manufactured by using the plurality of solar cells 10 formed by cutting the mother solar cell, output loss (that is, cell to module loss (CTM loss)) of the solar cell panel 100 can be reduced.

The output loss has a value obtained by multiplying a square of current by resistance in each solar cell 10, and the output loss of the solar cell panel 100 including a plurality of solar cells 10 has a value obtained by multiplying the value, which is obtained by multiplying the square of the current and the resistance in each solar cell 10, by a number of the plurality of solar cells 10. In the current of each solar cell 10, there is a current generated by an area of the solar cell 10 itself. Thus, the current increases when the area of the solar cell 10 increases, while the current decreases when the area of the solar cell 10 decreases.

Therefore, when the solar cell panel 100 is formed using the solar cells 10 manufactured by cutting the mother solar cell, current of the solar cell 10 decreases in proportion to an area, while a number of the solar cell 10 increases on the contrary. For example, when there are four solar cells 10 manufactured from a mother solar cell, the current in each solar cell 10 is reduced to one quarter of the current of the mother solar cell, and the number of solar cells 10 is four times the number of the mother solar cell. Since the current is reflected in square and the number is reflected as it is, the output loss is reduced to one quarter. Accordingly, the output loss of the solar cell panel 100 according to the embodiment can be reduced.

In the embodiment, a mother solar cell is manufactured as in the prior art, and then, the solar cell 10 is formed by cutting the mother solar cell. According to this, the mother solar cell can be manufactured by manufacturing a solar cell using the existing apparatus and the optimized design as it is, and then, the solar cell 10 can be manufactured by cutting the mother solar cell. As a result, facility burden and process cost burden can be minimized. On the other hand, if a size of the solar cell itself is reduced, an apparatus is needed to be replaced and setting or a design is needed to be changed.

More specifically, a mother solar cell or a semiconductor substrate thereof may be manufactured from an approximate circular-shaped ingot and may have a circular shape, a square shape, or a shape having the same or similar lengths in two perpendicular directions (an x-axis direction and a y-axis directions in the drawings). For example, a semiconductor substrate of a mother solar cell may have an octagonal shape having an inclined portion at four corner portions in an approximate square shape. With such a shape, a semiconductor substrate having the largest area can be obtained from the same ingot.

For reference, four solar cells 10 adjacent to each other in order from a top in FIG. 2 may be manufactured from one mother solar cell. However, embodiments of the invention are not limited thereto. For example, one mother solar cell may be cut to form two to twelve solar cells 10 (e.g., four to eight solar cells 10, as an example, six solar cells 10). Then, a ratio of a width in a short axis: a length in a long axis of each solar cell 10 is 1:1.5 to 1:12.5 (e.g., 1:3.5 to 1:8.5, as an example, 1:5.5 to 1:6.5). When the ratio has the above range, it may be regarded that two to twelve (e.g., four to eight, as an example, six) solar cells 10 are formed by cutting one mother solar cell considering a process error or so on. If a number of solar cells 10 manufactured by cutting one mother solar cell is more than 12, a width of the solar cell 10 in a short axis is small, and thus, damage (for example, an impact due to laser or mechanical processing) or the like may increase, and it may be difficult to simplify a manufacturing process due to an increase in a number of connection processes. When a number of solar cells 10 manufactured by cutting one mother solar cell is 4 to 8 (for example, 6), the solar cells 10 can be stably connected and the output loss can be effectively reduced. However, embodiments of the invention are not limited thereto, and the number of solar cells 10 manufactured from one mother solar cell may have any of various values.

As described above, a mother solar cell may have a symmetrical shape. A maximum horizontal width (a horizontal width across a center of a semiconductor substrate) and a maximum vertical width (a vertical width across a center of a semiconductor substrate) may be the same in the mother solar cell.

The solar cell 10 formed by cutting the mother solar cell along a cutting line extending in one direction (for example, a y-axis direction in the drawing) may have a long axis and a short axis. The plurality of solar cells 10 manufactured by the same are electrically connected to each other by using an adhesive member 142 positioned at an overlap area OP to form a solar cell string 102. An interconnector member 104 may be connected to one end of the solar cell string 102 (more particularly, an end solar cell 10c positioned at an end of the solar cell string 102).

Hereinafter, a structure of a solar cell 10 will be described with reference to FIG. 3 and FIG. 4, and a connection structure of a plurality of solar cells 10 and a connection structure of the solar cell 10 and an interconnector member 104 will be described in more detail with reference to FIG. 1 to FIG. 4.

Referring to FIG. 3, a solar cell 10 according to the embodiment includes a semiconductor substrate 12, a conductive region 20 or 30 formed at or on the semiconductor substrate 12, and an electrode 42 or 44 connected to the conductive region 20 or 30. That is, the solar cell 10 according to the embodiment may be a crystalline solar cell based on the semiconductor substrate 12. For example, the conductive region 20 or 30 may include a first conductive region 20 and a second conductive region 30 having different conductivity types, and the electrode 42 or 44 may include a first electrode 42 connected to the first conductive region 20 and a second electrode 44 connected to the second conductive region 30.

The semiconductor substrate 12 may include a base region 14 including a first or second conductivity type dopant to have a first or second conductivity type at a relatively low doping concentration. In one example, the base region 14 may have a second conductivity type. The base region 14 may be formed of a single-material crystalline semiconductor (e.g., a single-material single-crystalline or polycrystalline semiconductor, such as, single-crystalline or polycrystalline silicon, more particularly, single-crystalline silicon) including a first or second conductivity type dopant. The solar cell 10 based on the base region 14 or the semiconductor substrate 12 having a high degree of crystallinity and having few defects is excellent in electrical property. In this instance, at least one of a front surface and a back surface of the semiconductor substrate 12 may be provided with a texturing structure or an anti-reflection structure having a concavo-convex shape or an uneven shape such as a pyramid to minimize reflection.

The conductive region 20 or 30 may include the first conductive region 20 having the first conductivity type and positioned on one surface (for example, a front surface) of the semiconductor substrate 12, and the second conductive region 30 having the second conductivity type and positioned on the other surface (e.g., a back surface) of the semiconductor substrate 12. The conductive regions 20 and 30 may have a conductivity type different than that of the base region 14 or may have a higher doping concentration than the base region 14. In the embodiment, the first and second conductive regions 20 and 30 are formed of a doped region constituting a part of the semiconductor substrate 12, and thus, a junction property with the base region 14 can be improved. In this instance, the first conductive region 20 or the second conductive region 30 may have a homogeneous structure, a selective structure, or a local structure.

However, embodiments of the invention are not limited thereto, and at least one of the first and second conductive regions 20 and 30 may be formed separately from the semiconductor substrate 12 on the semiconductor substrate 12. In this instance, the first or second conductive region 20 or 30 may be formed of a semiconductor layer (for example, an amorphous semiconductor layer, a microcrystalline semiconductor layer, or a polycrystalline semiconductor layer, for example, an amorphous silicon layer, a microcrystalline silicon layer, or a polycrystalline silicon layer) having a crystal structure different from that of the semiconductor substrate 12. Then, the first or second conductive region 20 or 30 can be easily formed on the semiconductor substrate 12.

One of the first and second conductive regions 20 and 30, which has a conductivity type different from that of the base region 14, constitutes at least a part of an emitter region. The other one of the first and second conductive regions 20 and 30, which has a conductivity type the same as that of the base region 14, constitutes at least a part of a surface field region. For example, in the embodiment, the base region 14 and the second conductive region 30 may have an n-type as the second conductivity type, and the first conductive region 20 may have a p-type. Then, the base region 14 and the first conductive region 20 form a pn junction. When light is incident to the pn junction, electrons generated by a photoelectric effect move toward the back surface of the semiconductor substrate 12 and are collected by the second electrode 44, and holes move toward the front surface of the semiconductor substrate 12 and are collected by the first electrode 42, thereby generating electric energy. Then, holes having a slower moving speed than electrons may move to the front surface of the semiconductor substrate 12, not the back surface thereof, thereby improving efficiency. However, embodiments of the invention are not limited thereto. Thus, the base region 14 and the second conductive region 30 may have a p-type and the first conductive region 20 may have an n-type. Also, the base region 14 may have the conductivity type the same as that of the first conductive region 20 and opposite to that of the second conductive region 30.

In this instance, as the first or second conductivity type dopant, any of various materials which represent n-type or p-type may be used. As the p-type dopant, a group III element such as boron (B), aluminum (Al), gallium (Ga), or indium (In) may be used. As the n-type, a group V element such as phosphorus (P), arsenic (As), bismuth (Bi), or antimony (Sb) may be used. For example, the p-type dopant may be boron (B) and the n-type dopant may be phosphorus (P).

A first passivation layer 22 and/or an anti-reflection layer 24, which is a first insulating layer, may be formed on (e.g., in contact with) the front surface of the semiconductor substrate 12 (more particularly, the first conductive region 20 formed at the front surface of the semiconductor substrate 12). A second passivation layer 32, which is a second insulating layer, may be formed on (e.g., in contact with) the back surface of the semiconductor substrate 12 (more particularly, the second conductive region 30 formed at the back surface of the semiconductor substrate 12). The first passivation layer 22, the anti-reflection layer 24, and the second passivation layer 32 may be formed of any of various insulating materials. For example, the first passivation layer 22, the anti-reflection layer 24, or the second passivation layer 32 may be formed of a single layer or have a multi-layered structure in which two or more layer are included. The single layer or the multi-layered structure may include at least one of a silicon nitride film, a silicon nitride film including hydrogen, a silicon oxide film, a silicon oxynitride film, an aluminum oxide film, a silicon carbide film, ZnS, $TiO_2$, and $CeO_2$. However, embodiments of the invention are not limited thereto.

The first electrode 42 is electrically connected to (e.g., in direct contact with) the first conductive region 20 through an opening passing through the first insulating layer and the second electrode 44 is electrically connected (e.g., in direct contact with) to the second conductive region 30 through an opening passing through the second insulating layer. The first and second electrodes 42 and 44 are formed of any of various conductive materials (e.g., a metal) and may have any of various shapes.

Referring to FIGS. 3 and 4, the first electrode 42 may include a plurality of first finger electrodes 42a spaced apart from each other with a predetermined pitch. In FIG. 4, it is exemplified that the first finger electrodes 42a extend in a short axis direction, are parallel to each other, and are parallel to one edge of the semiconductor substrate 12.

The first electrode 42 may include a first bus bar electrode 42b extending in a long axis direction (a y-axis direction in the drawing) crossing (for example, perpendicular to) the short axis direction to connect ends of the first finger electrodes 42a. The first bus bar electrode 42b may be positioned in the overlap area OP. The overlap area OP is a portion where two adjacent solar cells 10 overlap each other and is a portion where the adhesive member 142 connecting the two adjacent solar cells 10 is positioned. In this instance, a width of the first bus bar electrode 42b in the short axis direction may be greater than a width of the first finger electrode 42a in the long axis direction, but embodiments of the invention are not limited thereto. Therefore, the width of the first bus bar electrode 42b may be equal to or less than the width of the first finger electrode 42a. Also, the first bus bar electrode 42b may be not positioned in the overlap area OP. Further, the first bus bar electrode 42b positioned in the overlap area OP may be not provided.

In a cross-sectional view, both of the first finger electrode 42a and the first bus bar electrode 42b of the first electrode 42 may penetrate through the first insulating layer. However, embodiments of the invention are not limited thereto. As another example, the first finger electrode 42a of the first electrode 42 may penetrate through the first insulating layer, and the first bus bar electrode 42b may be formed on the first insulating layer.

Similarly, the second electrode 44 may include a plurality of second finger electrodes 44a, and a second bus bar electrode 44b connecting ends of the plurality of second finger electrodes 44a. The content of the first electrode 42 may be applied to the second electrode 44 as it is and the content of the first insulating layer with respect to the first electrode 42 may be applied to the second insulating layer with respect to the second electrode 44 as it is, if there is no other description. The width and the pitch of the first finger electrode 42a and the first bus bar electrode 42b of the first electrode 42 may be the same as or different from the width and the pitch of the second finger electrode 44a and the second bus bar 44b of the second electrode 44.

In the embodiment, it is exemplified that one first bus bar electrode 42b of the first electrode 42 is provided at one end portion of the first finger electrode 42a of the first electrode 42, and one second bus bar electrode 44b of the second electrode 44 is provided at the other portion of the second finger electrode 44a of the second electrode 44. More specifically, the first bus bar electrode 42b may extend along a long axis direction (a y-axis direction in the drawing) of the semiconductor substrate 12 at one side of the semiconductor substrate 12 in a short axis direction, and the second bus bar electrode 44b may extend along the long axis direction of the semiconductor substrate 12 at the other side of the semiconductor substrate 12 in the short axis direction.

Then, when the solar cell 10 is connected, the first bus bar electrode 42b positioned at the one side of one solar cell 10 and the second bus bar electrode 44b positioned at the other side of the adjacent solar cell 10 are adjacent to each other at the overlap area OP, and thus, the two adjacent solar cells 10 can be stably connected by adhering them with the adhesive member 142. In addition, the first bus bar electrodes 42b and 44b may be formed only at one side on one surface, and thus, a material cost of the first and second electrodes 42 and 44 can be reduced and a manufacturing process for forming the first and second electrodes 42 and 44 can be simplified.

However, embodiments of the invention are not limited thereto. Therefore, the first or second bus bar electrode 42b or 44b may not be included, or electrodes may have any of different shapes from those of the first and second finger electrodes 42a and 44a. Also, unlike the above, planar shapes of the first electrode 42 and the second electrode 44 may be different from each other or may have no similarity, and various other modifications are possible.

Referring to FIGS. 1 to 4, in the embodiment, a plurality of solar cells 10 each having a long axis and a short axis may extend in one direction by using an overlap area OP and an adhesive member 142.

More specifically, an overlap area OP where parts of two adjacent solar cells (that is, the first and second solar cells 10a and 10b) in the plurality of solar cells 10 overlap each other is included. That is, a part at one side of the first solar cell 10a in the short axis direction overlaps with a part at the other side of the second solar cell 10b to form the overlap area OP, and the overlap area OP extends in the long axis direction of the first and second solar cells 10a and 10b. The adhesive member 142 is positioned between the first and second solar cells 10a and 10b in the overlap area OP to connect the first and second solar cells 10a and 10b. The adhesive member 142 may extend in the long axis direction of the first and second solar cells 10a and 10b along the overlap area OP. Thus, the first electrode 42 of the first solar cell 10a positioned at the overlap area OP and the second electrode 44 of the second solar cell 10b positioned at the overlap area OP are electrically connected to each other. Then, when the solar cells 10 each having the short axis and the long axis are connected as described above, the adhesive member 142 is positioned to extend in the long axis direction in the solar cell 10 having the short axis and the long axis, and thus, a connection area can be sufficiently secured and the solar cells 10 can be stably connected.

The connection structure of the adjacent first and second solar cells 10a and 10b as described above is successively repeated in two solar cells 10 adjacent to each other so that a plurality of solar cells 10 are connected in a first direction (an x-axis direction in the drawing) or a short axis direction of the solar cell 10 to form a solar cell string 102 formed of one row. Such a solar cell string 102 may be formed by any of various methods or apparatuses.

The adhesive member 142 may include an adhesive material. As the adhesive material, any of various materials having electrical conductivity and an adhesive property to be able to electrically and physically connect the two solar cells 10 may be used. For example, the adhesive member 142 may be formed of an electrical conductive adhesive (ECA) material, a solder, or the like. In one example, the adhesive member 142 may be formed of an electrical conductive adhesive material.

The electrical conductive adhesive material may be a viscous liquid or paste material including a conductive material, a binder, a solvent and the like. The electrical conductive adhesive material may be applied by a nozzle or the like, and then, cured at a predetermined temperature so that electrical connection is achieved by the electrical conductive adhesive material. Most of the solvent in the curing process may be removed. Such an electrical conductive adhesive material may have a thickness, a shape, and so on for a good adhesion property, and may be applied and cured by a simple process.

Interconnector members 104 may be electrically connected to ends of the solar cell string 102 for connecting the solar cell string 102 to another solar cell string 102 or an outside (for example, an external circuit, as an example, a junction box), respectively. More specifically, an interconnector member 104 may be electrically connected to an end of an end solar cell 10c positioned at one end of the solar cell string 102, and an interconnector member 104 may be electrically connected to the other end of an end solar cell 10c positioned at the other end of the solar cell string 102. The interconnector members 104 are for connecting a plurality of solar cell strings 102 in parallel. A block diode 250 may be disposed between the solar cell string 102 and the interconnector member 104 (that is, between the end solar cell 10c and the interconnector member 104).

Figure 5:
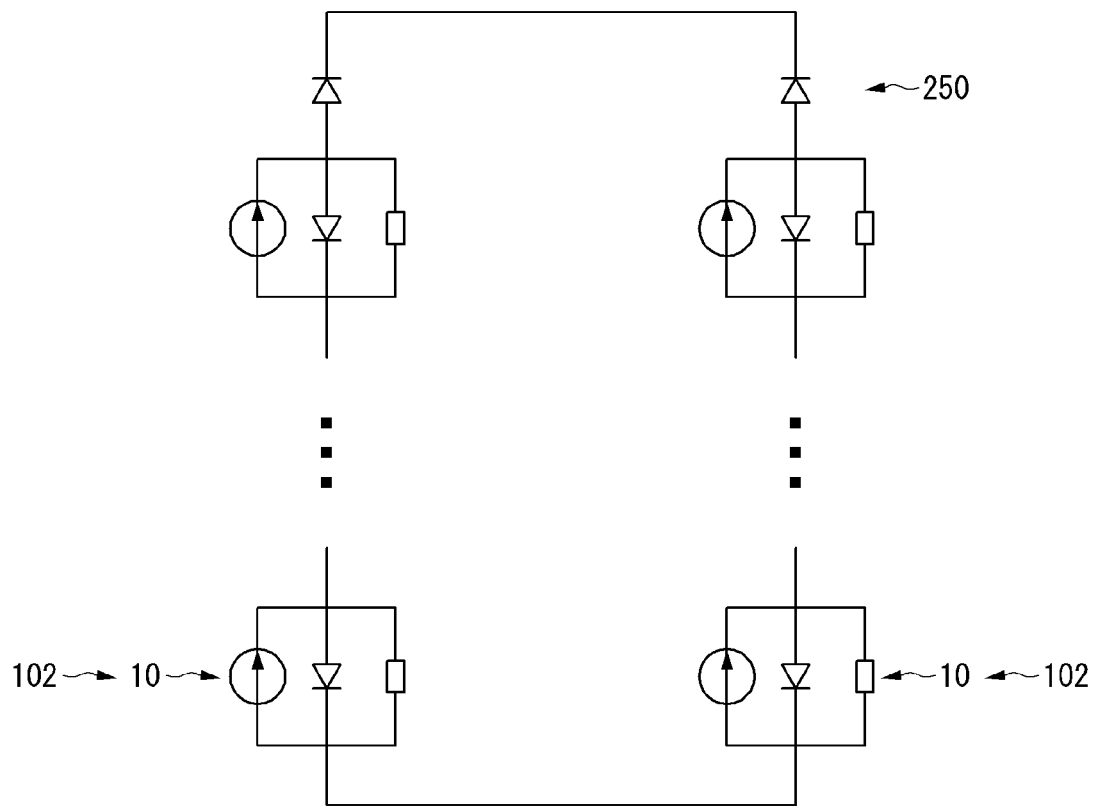
FIG. 5 is a block diagram showing a circuit structure of a plurality of solar cell strings and block diodes connected thereto, which are shown in FIG. 2.
Figure 6:
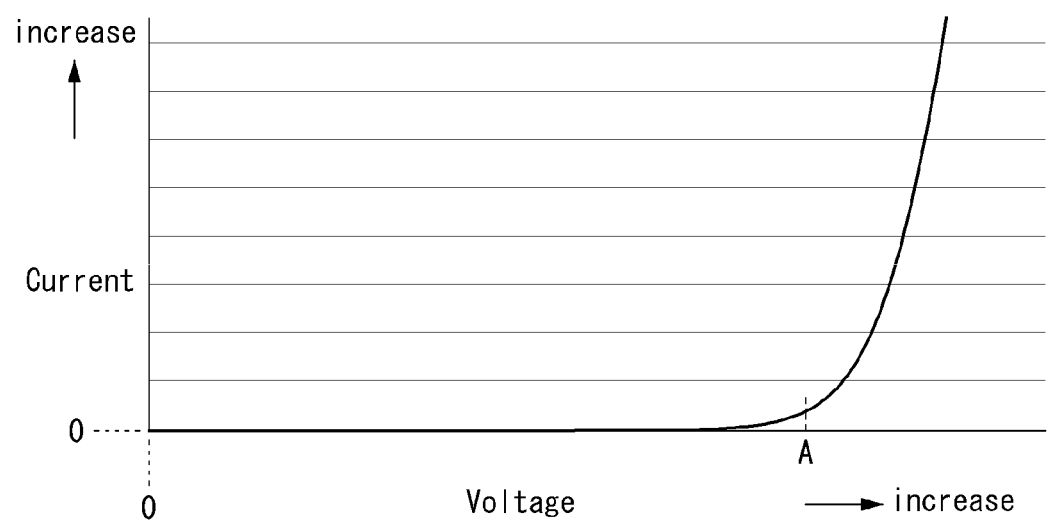
FIG. 6 is a current-voltage graph in a state where light is not incident to a block diode included in a solar cell panel according to an embodiment of the invention.
Figure 7:
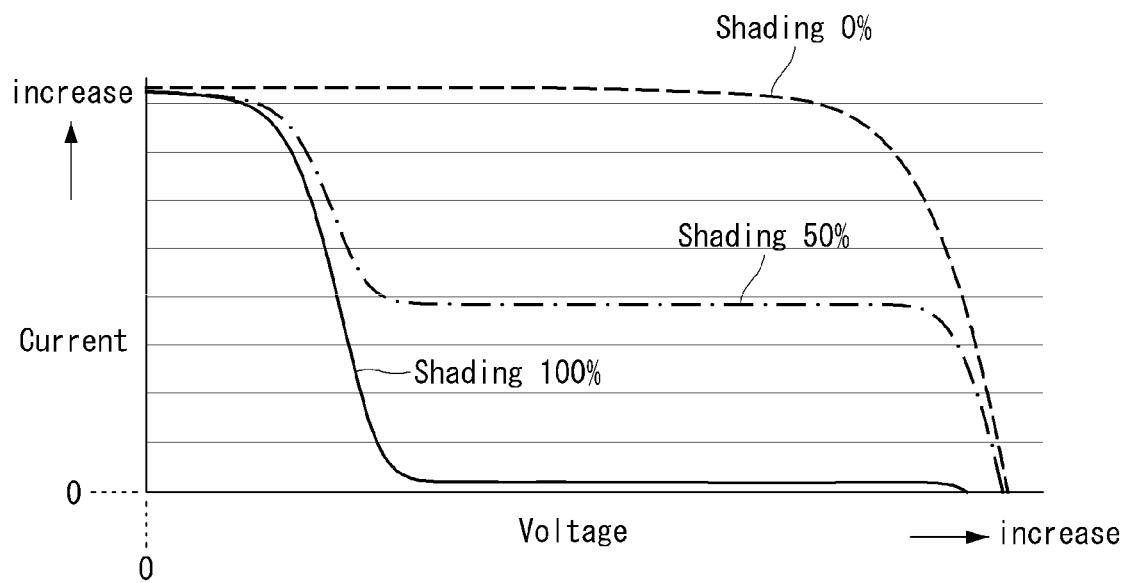
FIG. 7 is a current-voltage graph according to a ratio of a number of shaded solar cells in a state that a block diode formed of a solar cell unit and included in a solar cell panel according to an embodiment of the invention is provided.

The block diode 250 will be described in more detail with reference to FIGS. 5 to 7. FIG. 5 is a block diagram showing a circuit structure of a plurality of solar cell strings 102 and block diodes 250 connected thereto, which are shown in FIG. 2. FIG. 6 is a current-voltage graph in a state where light is not incident to a block diode formed of a solar cell unit and included in a solar cell panel according to an embodiment of the invention. FIG. 7 is a current-voltage graph according to a shading ratio (a ratio of a number of shaded solar cells) in a state that a block diode formed of a solar cell unit and included in a solar cell panel according to an embodiment of the invention is provided.

In the embodiment, the block diode 250 may be formed of a solar cell unit. For example, the block diode 250 may include a sub-semiconductor substrate 212 including a sub-base region 214 to correspond to the semiconductor substrate 12 of the solar cell 10, a first sub-conductive region 220 corresponding to the first conductive region 20 of the solar cell 10, and a second sub-conductive region 230 corresponding to the second conductive region 30 of the solar cell 10. The block diode 250 may further include first and second sub-electrodes 242 and 244, first and second sub-passivation layers 222 and 232, and a sub-anti-reflection layer 224, which correspond to the first and second electrodes 42 and 44, the first and second passivation layers 22 and 32, and the anti-reflection layer 24 of the solar cell 10, respectively. The description of the semiconductor substrate 12, the first and second conductive regions 20 and 30, the first and second electrodes 42 and 44, the first and second passivation layers 22 and 32, and the anti-reflection layer 24 of the solar cell 10 may be applied to the sub-semiconductor substrate 212, the first and second sub-conductive regions 220 and 230, the first and second sub-electrodes 242 and 244, the first and second sub-passivation layers 222 and 232, and the sub-anti-reflection layer 224 of the block diode 250 as they are, and thus, the detailed description thereto will be omitted. For example, the solar cell 10 and a solar cell unit of the block diode 250 may have the same structure (e.g., the same laminated structure and the same planar shape).

In this instance, the first conductive region 20 of the solar cell 10 and the first sub-conductive region 220 of the block diode 250 may be electrically connected to each other and the second conductive region 30 of the solar cell 10 and the second sub-conductive region 230 of the block diode 250 may be electrically connected to each other. The block diode 250 may be positioned at a non-light-incident region (non-light-receiving region) where sunlight is not incident.

As shown in FIG. 5, the block diode 250 may serve as a diode connected in series to the end solar cell 10c for allowing a current to flow in a predetermined direction. That is, when light is incident to the solar cell 10, the current flows from an n-type region (for example, one of the first and second conductive regions 20 and 30) to a p-type region (for example, the other of the first and second conductive regions 20 and 30) by a photoelectric conversion. On the other hand, in the block diode 250 having the structure of the solar cell unit and positioned at the non-light-incident region, the current flows from the p-type region to the n-type region. Thus, the solar cells 10 are not shaded and the solar cell string 102 has a voltage of a certain value or more, the block diode 250 is turned on and does not interfere with the current flow. However, when at least one solar cell 10 is shaded and the solar cell string 102 has a voltage below a certain value, the block diode 250 is turned off and prevents the current flow of the solar cell string 102 which voltage is below the certain value due to a reverse voltage.

Referring to FIG. 6, the block diode 250 formed of the solar cell unit is turned at a certain voltage (that is, A in FIG. 6) or more, while the block diode 250 formed of the solar cell unit is turned off below the certain voltage. Therefore, the block diode 250 can sufficiently act as a diode. Referring to FIG. 7, the current is reduced as the shading ratio that is the ratio of the number of the shaded solar cells 10 increases in proportion to the shading ratio. Thus, it can be seen that the block diode 250 formed of the solar cell unit can sufficiently act as a diode to prevent the current from flowing to the solar cell string 102 including the solar cell 10 which does not operate normally.

If the block diode 250 is not provided, when a plurality of solar cell strings are connected in parallel and some of the plurality of solar cells are not operated normally due to defects, shading, or the like, a reverse voltage may generate and the current that should flow in a forward direction may flow in a reverse direction, and thus, the solar cell panel 100 may be damaged or entire output of the solar cell panel 100 may be deteriorated. When the block diode 250 is provided, the block diode 250 can block a reverse voltage or a reverse current that may be generated when some solar cells are not operated normally due to defects, shading, etc., thereby effectively preventing damage of the solar cell panel 100 or decrease in output of the solar cell panel 100.

When the block diode 250 formed of the solar cell unit is positioned at the non-light-incident region, the block diode 250 can sufficiently act as a diode. Accordingly, a solar cell unit, which has an efficiency below a certain level, has a portion where a color has been changed, or has a portion being damaged or cracked and thus is determined to be defective, among a plurality of solar cells manufactured to be applied to the solar cell panel 100 may be used as the block diode 250 as it is. Even if a solar cell unit is determined to be defective because it does not satisfy a strict condition, the solar cell unit can sufficiently act as a diode to flow a current in a predetermined direction. Thus, if such a solar cell unit is used as the block diode 250, the effect by the block diode 250 formed of the solar cell unit can be achieved sufficiently. In the related art, the solar cell unit, which is determined to be defective, was not used as the solar cell 10 and thus was discarded. On the other hand, in the embodiment, a manufacturing cost corresponding to the block diode 250 can be reduced by using the solar cell unit as the block diode 250, and a connection structure between the solar cells 10 may be used as a connection structure between the solar cells 10 and the block diode 250 as it is and thus the connection structure can be simplified. Thus, the manufacturing cost of the solar cell panel 100 can be reduced and the structure can be simplified by using the block diode 250 having a simple connection structure with the solar cell 10, low manufacturing cost, and excellent properties.

More specifically, the end solar cell 10c and the block diode 250 are spaced apart from each other with a space portion S in a first direction, and the end solar cell 10c and the block diode 250 may be connected to each other by a connecting member 202 which cross the space portion S and overlaps a part of the end solar cell 10c and a part of the block diode 250. The block diode 250 connected to the end solar cell 10c by the connecting member 202 may be folded or bent and positioned on a back surface of the solar cell string 102. Then, the block diode 250 may be positioned at the non-light-incident region with a simple structure and excellent appearance can be maintained.

In this instance, the first conductive region 20 and the first sub-conductive region 220 may be positioned on the same plane or the same surface (for example, a front surface), and the second conductive region 30 and the second sub-conductive regions 230 may be positioned on the same plane or the same surface (for example, a back surface). For example, the first electrode 42 connected to the first conductive region 20 of the solar cell 10 and positioned on the front surface of the solar cell 10 and the first sub-electrode 242 connected to the first sub-conductive region 220 of the block diode 250 and positioned on the front surface of the block diode 250 are connected to each other by a first connecting member 204. The second electrode 44 connected to the second conductive region 30 of the solar cell 10 and positioned on the back surface of the solar cell 10 and the second sub-electrode 244 connected to the second sub-conductive region 230 of the block diode 250 and positioned on the back surface of the block diode 250 are connected to each other by a second connecting member 206. Then, the connection structure by the connecting member 202 can be simplified.

In this instance, the first connecting member 204 includes a first portion 204a and a second portion 204b. The first portion 204a may include a first overlapped portion 2042a that overlaps the solar cell 10 and a first connecting portion 2044a that protrudes from the first overlapped portion 2042a to the space portion S. The second portion 204b may include a second overlapped portion 2042b that overlaps the block diode 250 and a second connecting portion 2044b that protrudes from the second overlapped portion 2042b to the space portion S. The first overlapped portion 2042a and the first electrode 42 of the solar cell 10 may be fixed and connected (for example, physically and electrically connected) to each other by an adhesive member 142 positioned therebetween. The second overlapped portion 2042b and the first sub-electrode 242 of the block diode 250 may be fixed and connected (for example, physically and electrically connected) to each other by an adhesive member 142 positioned therebetween. The first connecting portion 2044a and the second connecting portion 2044b may be fixed to each other by soldering.

More specifically, the first and second overlapped portions 2042a and 2042b may extend in the long axis direction while overlapping an end portion of the end solar cell 10c or the block diode 250. The first and second connecting portions 2044a and 2044b may be disposed in the space portion S. The first connecting portion 2044a may include a plurality of first connecting portions 2044a each having a width smaller than a width of the first overlapped portion 2042a in the long axis direction. The second connecting portion 2044b may include a plurality of second connecting portions 2044b each having a width smaller than a width of the second overlapped portion 2044a in the long axis direction. Then, a connecting area of the first and second overlapped portions 2042a and 2042b with the end solar cell 10c or the block diode 250 can be sufficiently secured by the first and second overlapped portions 2042a and 2042b, thereby improving a connection property. The first and second connecting portions 2044a and 2044b, which are partially protruded and provided in plural, enable stable connection while reducing a material cost, and can be easily folded or bent along a bending line (a bent line) BL. The bending line BL will be described later in more detail.

Similarly, the second connecting member 206 includes a first portion 206a and a second portion 206b. The first portion 206a may include a first overlapped portion 2062a that overlaps the solar cell 10 and a first connecting portion 2064a that protrudes from the first overlapped portion 2062a to the space portion S. The second portion 206b may include a second overlapped portion 2062b that overlaps the block diode 250 and a second connecting portion 2064*b* that protrudes from the second overlapped portion 2062*b* to the space portion S. The first overlapped portion 2062*a* and the second electrode 44 of the solar cell 10 may be fixed and connected (for example, physically and electrically connected) to each other by an adhesive member 142 positioned therebetween. The second overlapped portion 2062*b* and the second sub-electrode 244 of the block diode 250 may be fixed and connected (for example, physically and electrically connected) to each other by an adhesive member 142 positioned therebetween. The first connecting portion 2064*a* and the second connecting portion 2064*b* may be fixed to each other by soldering.

Figure 8:
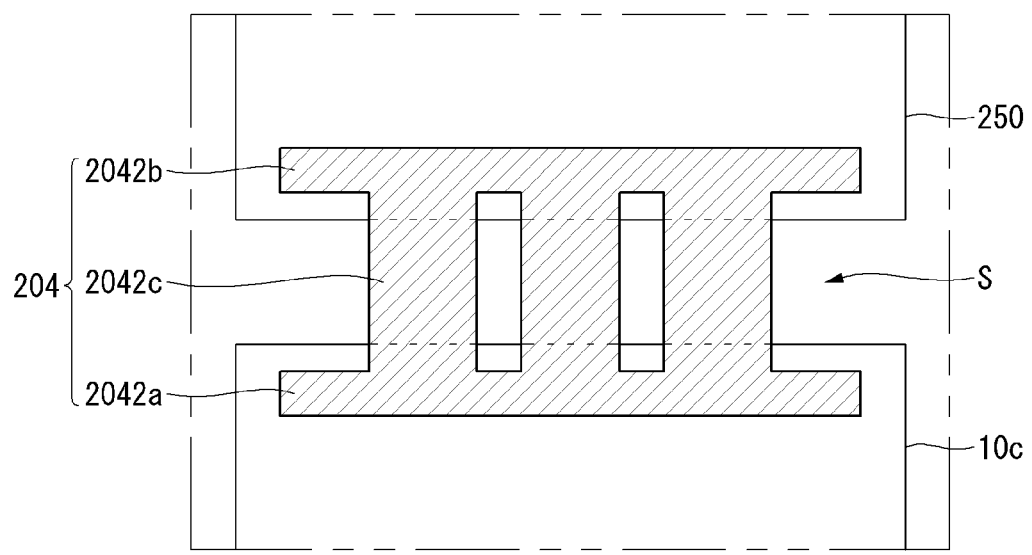
FIG. 8 is a partial developed view showing a connecting member included in a solar cell panel according to a modified embodiment of the invention as an unfolded state.

However, embodiments of the invention are not limited thereto. As shown in FIG. 8, the first connecting member 204 may have an integral structure including a first overlapped portion 2042*a*, a second overlapped portion 2042*b*, and a connecting portion 2042*c*. The first overlapped portion 2042*a* overlaps the solar cell 10, the second overlapped portion 2042*b* overlaps the block diode 250, and the connecting portion 2042*c* formed across the space portion S so as to connect the first overlapped portion 2042*a* and the second overlapped portion 2042*b*. The first and second overlapped portions 2042*a* and 2042*b* may be fixed to the solar cell 10 and the block diode 250, respectively, by the adhesive member 142. Although the first connecting member 204 is shown in FIG. 8 as an example, the second connecting member 206 may have a shape as shown in FIG. 8. The first connecting member 204 and the second connecting member 206 may have the same structure or may have different structures. Other variations are possible.

Referring again to FIGS. 1 to 4, an insulating layer 134 may be interposed between the solar cell 10 and the block diode 250 for insulating the solar cell 10 and the block diode 250. The insulating layer 134 will be described later in more detail.

The interconnector member 104 may include a first interconnector 105 and a second interconnector 106. The first interconnector 105 may be connected to an end of the solar cell string 102 or an end solar cell 10*c* positioned at the end of the solar cell string 102 to correspond to the solar cell string 102 or the end solar cell 10*c* thereof. The second interconnector 106 may have a separate structure from the first interconnector 105 and may be connected to the first interconnector 105. In this instance, a first interconnector 105 may be connected (for example, directly connected) to the block diode 250 connected to the end solar cell 10*c* at one end, while another first interconnector 105 may be connected (for example, directly connected) to another end solar cell 10*c* at the other end.

The first interconnectors 105 are positioned individually to correspond to the respective solar cell strings 102 and protrude to the outside in a longitudinal direction of the solar cell string 102 (that is, in the first direction (an x-axis direction in the drawing) or the short axis direction of the solar cell 10). The second interconnector 106 may include a portion extending in a second direction that crosses (for example, perpendicular to) the longitudinal direction of the solar cell string 102. In this instance, the second interconnector 106 may be positioned to connect at least some of the plurality of solar cell strings 102 (that is, to be connected to a plurality of first interconnectors 105 included in a plurality of solar cell strings 102). However, embodiments of the invention are not limited thereto.

In this instance, the first interconnector 105 may include an overlapped portion 105*a* that overlaps the block diode 250 or the end solar cell 10 and a connecting portion 105*b* that protrudes from the overlapped portion 105*a* to an outside in the first direction (the x-direction of the drawing). Then, a connecting area of the overlapped portion 105*a* with the end solar cell 10*c* or the block diode 250 can be sufficiently secured by the overlapped portion 105*a*, thereby improving a connection property. The connecting portions 105*b*, which are partially protruded and provided in plural, enable stable connection while reducing a material cost, and can be easily folded or bent along a bending line BL. An adhesive member 142 may be positioned between the overlapped portion 105*a* and the first or second sub-electrode 242 or 244 of the block diode 250 or between the overlapped portion 105*a* and the first or second electrode 42 or 44 of the end solar cell 10*c* to fix and connect (for example, physically and electrically connect) them.

The first interconnectors 105 may be positioned at one end and the other end of each solar cell string 102, respectively. The first interconnector 105 may be connected to the first electrode 42 positioned at the front surface of the solar cell 10 (more particularly, the first sub-electrode 242 connected to the first electrode 42) at one end of each solar cell string 102, and the first interconnector 105 may be connected to the second electrode 44 positioned at the back surface of the end solar cell 10*c*.

The second interconnector 106 may include a portion extending in the second direction. For example, in an end solar cell 10*c* positioned at the one end of each solar cell string 102, the first interconnector 105 is positioned on the front side so as to be connected to the first electrode 42. In another end solar cell positioned at the other end of each solar string 102, the first interconnector 105 is positioned on the back surface so as to be connected to the second electrode 44. An second interconnector 106 may connect the connecting portions 105*b* of the first interconnectors 105 connected to the first electrodes 42 of the end solar cells 10*c* and protruded to one side at one side, and another second interconnector 106 may connect connecting portions 105*b* of the first interconnectors 105 connected to the second electrodes 44 of the end solar cells 10*c* and protruded to the other side at the other side. According to this, a plurality of solar cell strings 102 may be connected to each other in parallel by the first and second interconnectors 105 and 106. For example, the first interconnector 105 and the second interconnector 106 may be connected to each other by soldering, a conductive adhesive member, and the like.

The first and second interconnectors 105 and 106 and the connection structure thereof may have any of various other structures. It is exemplified that one interconnector member 104 is connected to the first sub-electrode 242 of the block diode 250 and another interconnector member 104 is connected to the second electrode 44 of the end solar cell 10*c* in the above description. However, embodiments of the invention are not limited thereto. One interconnector member 104 may be connected to the second sub-electrode 244 of the block diode 250 and another interconnector member 104 may be connected to the first electrode 42 of the end solar cell 10*c*.

In this instance, in order to minimize an area of a non-active area which is not directly involved in photoelectric conversion in the solar cell panel 100, to improve an appearance of the solar cell panel, and to serve as the block diode 250, a portion of the connecting member 202 may be folded or bent along the bending line BL. Then, the block diode 250 and the first and second interconnectors 105 and 106 may be positioned on the back surface of the solar cell string 102. In this instance, when the bending line BL is positioned at the first and/or second connecting portions 2044a and 2044b, it can be easily folded along the bending line BL.

In this instance, in order to prevent unnecessary electrical connection, an insulating layer 134 may be positioned between the first and second interconnectors 105 and 106 and the back surface of the solar cell string 102 and between the block diode 250 and the solar cell string 102. The insulating layer 134 may be formed to correspond to each of the first and second interconnectors 105 and 106 and the block diode 250, or may be formed to correspond to an entire portion of the first and second interconnectors 105 and 106 and the block diode 250. Also, the insulating layer 134 may have any of various other shapes. In this instance, the insulating layer 134 may have a transparent color or an opaque color that absorbs light so as to effectively prevent light from being incident on the block diode 250.

In FIG. 1, it is exemplified that an insulating member 135 is positioned between the first connecting member 204 and the second connecting member 206, but embodiments of the invention are not limited thereto. The sealing member 130 may fill a gap between the first and second connecting members 204 and 206, and other modifications are possible. Although it is exemplified that the block diode 250 and the first and second interconnectors 105 and 106 are positioned between the solar cell string 102 and the sealing member 130 in the drawing, the block diode 250 and the first and second interconnectors 105 and 106 may be positioned on a back surface of the sealing member 130 and/or a back surface of the second cover member 120. In this instance, the insulating layer 134 may not be positioned. In one example, the block diode 250 and the first and second interconnectors 105 and 106 may be attached to a back surface of the second cover member 120. Accordingly, since the block diode 250 is embedded or integrated into the solar cell panel 100, a separate structure (for example, a junction box) for receiving the block diode 250 may not be provided. Various other variations are possible.

The insulating layer 134 and/or the insulating member 135 may include any of various insulating materials (e.g., a resin) and may be formed in any of various forms or type, such as films, sheets, and the like. The insulating layer 134 and/or the insulating member 135 may be formed separately from the interconnector member 104 and then may be positioned between the solar cell string 102 and the interconnector member 104, the block diode 250, or so on, and/or between the first connecting member 204 and the second connecting member 206, respectively, when the interconnector member 104 is folded. The insulating layer 134 and the insulating member 135 may be formed of the same material or different materials.

For example, the connecting member 202, the first interconnector 105, and/or the second interconnector 106 may include a core layer and a solder layer formed on a surface of the core layer. The core layer may include any of various metals, and the solder layer may include any of various solder materials. For example, the solder layer may include Sn, SnAgCu, SnPb, SnBiCuCo, SnBiAg, SnPbAg, SnAg, SnBi or SnIn. According to this, a connection of the connecting member 202, and/or a connection of the first interconnector 105 and the second interconnector 106 may be formed by soldering. Then, the connecting member 202, and/or the first interconnector 105 and the second interconnector 106 can be connected in a simple process at a low temperature to have good electrical properties.

According to the embodiment, the block diode 250 having a simple connection structure with the solar cell 10, manufactured by a low manufacturing cost, and having excellent properties are included, and thus, a manufacturing cost of the solar cell panel 100 can be reduced and a structure of the solar cell panel 100 can be simplified.

In the above description and drawings, it is exemplified that the solar cell 10 has a cut-cell structure having a long axis and a short axis and adjacent solar cells 10 are connected by the overlap area OP and the adhesive member 142, and the block diode 250 has a cut-cell structure having a long axis and a short axis. According to this, the solar cell 10 and the block diode 250 may have substantially the same area. The substantially same area may mean areas having an error of less than 10%, or an area difference due to existence or absence of inclined portions.

However, embodiments of the invention are not limited thereto. The solar cell 10 may be formed of a mother solar cell which is not cut, which will be described in detail with reference to FIGS. 9 and 10.

Figure 9:
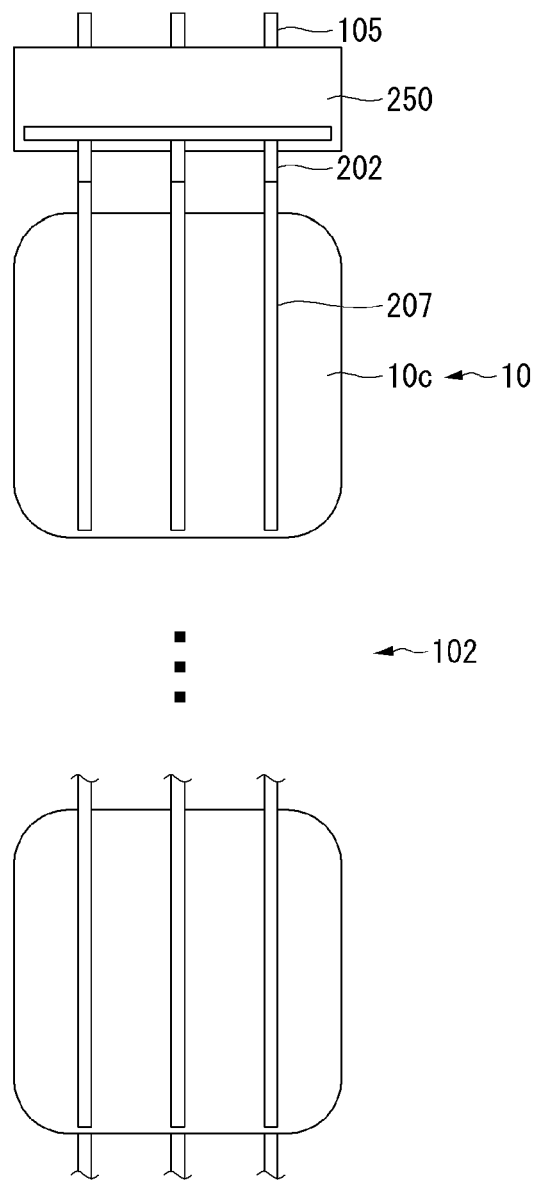
FIG. 9 is a plan view schematically showing a solar cell string and a block diode connected thereto, which are included in a solar cell panel according to another embodiment of the invention.

FIG. 9 is a plan view schematically showing a solar cell string 102 and a block diode 250 connected thereto, which are included in a solar cell panel according to another embodiment of the invention. FIG. 10 is a plan view schematically showing a solar cell string 102 and a block diode 250 connected thereto, which are included in a solar cell panel according to yet another embodiment.

As shown in FIGS. 9 and 10, a solar cell 10 may be formed of a mother solar cell which is not cut, or a ribbon 207 or a wiring member (for example, a wire) may extend from a front surface to a back surface so as to connect a first electrode positioned on a front surface and a second electrode positioned on a back surface to form a solar cell string 102. The block diode 250 may be positioned at one end of the solar cell string 102. In this instance, the block diode 250 may have a cut-cell structure as shown in FIG. 9, or may be formed of a mother solar cell that is not cut as shown in FIG. 10. Accordingly, a solar cell unit constituting the block diode 250 may have an area substantially the same as or smaller than that of the solar cell 10. Various other variations are possible.

Hereinafter, a solar cell panel according to another embodiment of the invention will be described in detail. Detailed descriptions will be omitted for the same or extremely similar parts as those described above, and only different parts will be described in detail. It is also within the scope of the invention to combine the above-described embodiments or variations thereof with the embodiments described below or modifications thereof.

Figure 11:
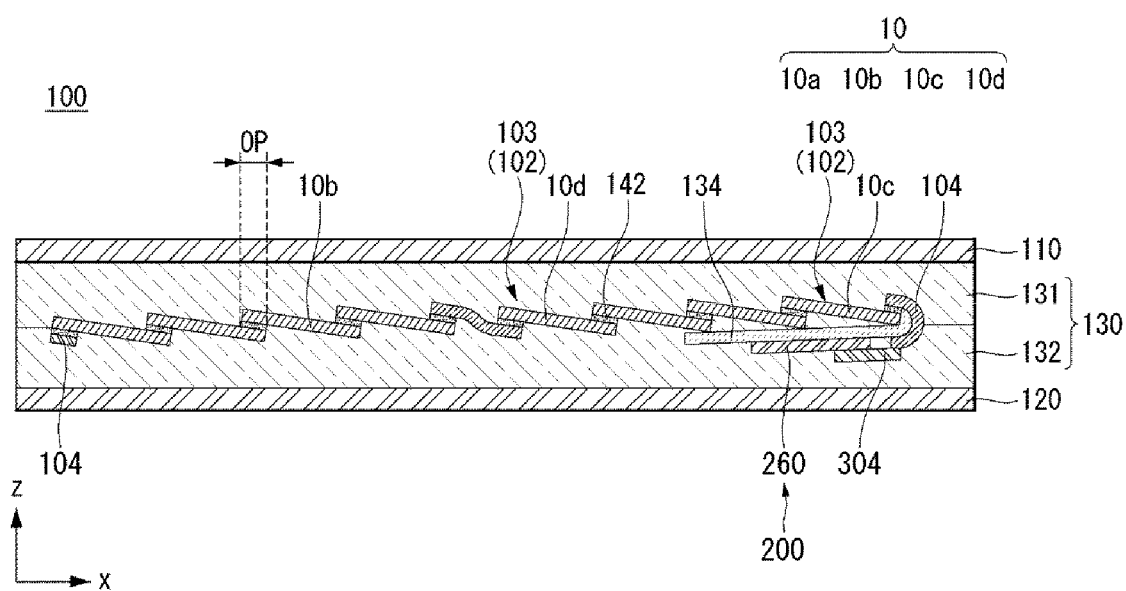
FIG. 11 is a schematic cross-sectional view showing a solar cell panel according to still another embodiment of the invention.

FIG. 11 is a schematic cross-sectional view showing a solar cell panel 100 according to still another embodiment of the invention.

Referring to FIG. 11, in a solar cell panel 100 according to the embodiment, a plurality of solar cells 10 form a plurality of solar cell groups 103, and a diode member 200 may be formed of a bypass diode 260 formed of a solar cell unit connected to the plurality of solar cell groups 103 and positioned at a non-light-incident region.

In this instance, the bypass diodes 260 may be connected to the respective solar cell groups 103 one by one in parallel. For example, in the embodiment, a plurality of solar cell groups 103 may include a first solar cell group 103a (see FIG. 14) and a second solar cell group 03b (see FIG. 14) connected in series to the first solar cell group 103a, and the bypass diode 260 may include a first bypass diode 200a (see FIG. 14) connected in parallel to the first solar cell group 103a and a second bypass diode 200b (see FIG. 14) connected in parallel to the second solar cell group 03b. In this instance, each of the first and second bypass diodes 200a and 200b may be formed of a solar cell unit positioned at a non-light-incident region. At least one (e.g., each) of the plurality of solar cell groups 103 may include a plurality of solar cell strings 102 connected in parallel to each other.

The solar cell panel 100 may further include an interconnector member 104, a sealing member 130, a first cover member 110, and a second cover member 120. The interconnector member 104 connects a solar cell group 103 to an outside (e.g., an external circuit) or another solar cell 10. The sealing member 130 surrounds and seals at least the solar cell groups 103. The first cover member 110 is positioned at one surface of the solar cell 10 on the sealing member 130 and the second cover member 120 is positioned at the other surface of the solar cell 10 on the sealing member 130.

The solar cell group 103 and the solar cells 10 included therein, which are included in the solar cell panel 100 according to the embodiment, will be described in detail with reference to FIGS. 12 and 13 together with FIG. 11.

Figure 12:
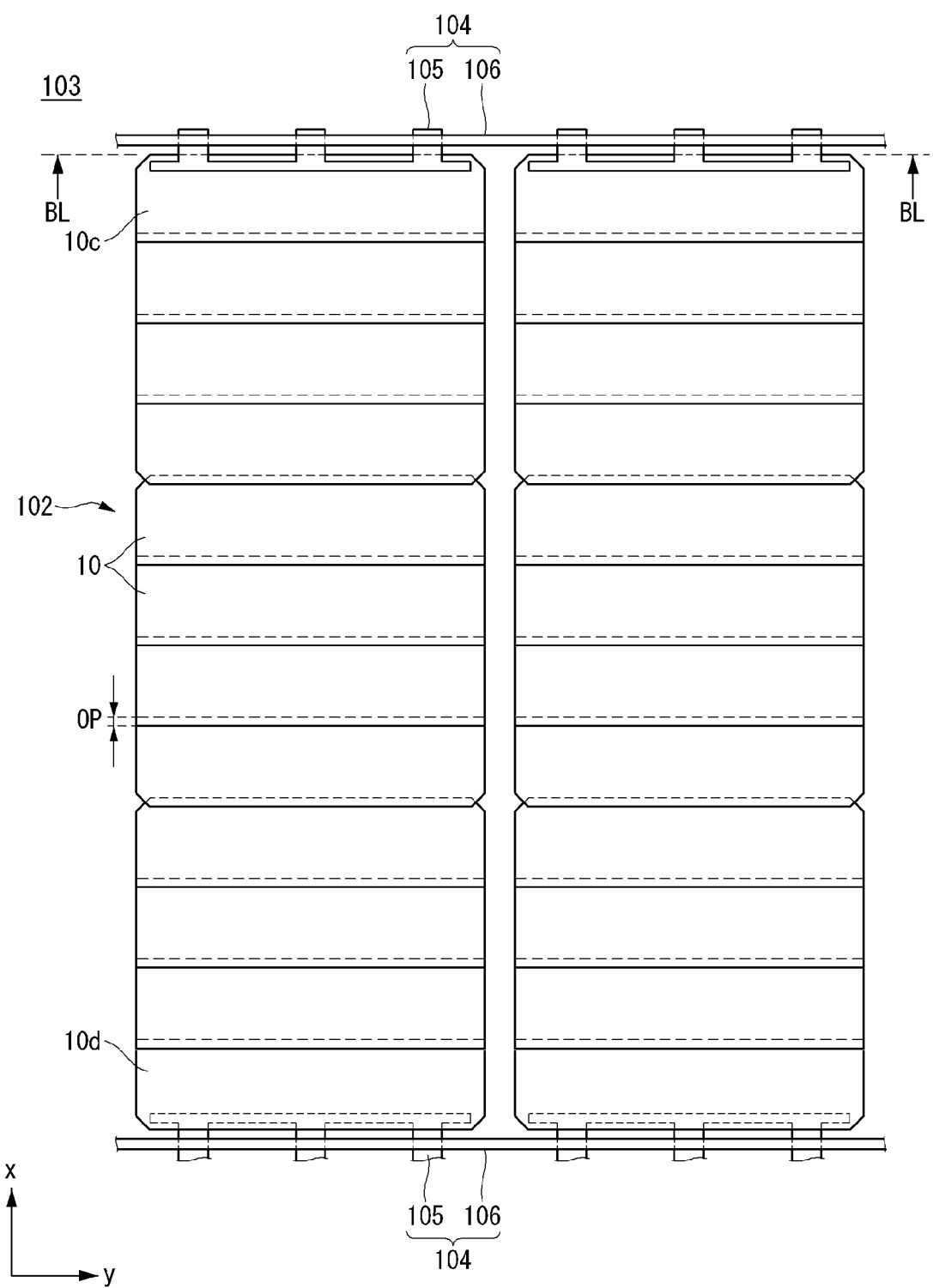
FIG. 12 is a front developed view schematically showing one solar cell group and interconnector members connected thereto, which are included in the solar cell panel shown in FIG. 11, as an unfolded state.

FIG. 12 is a front developed view schematically showing one solar cell group 103 and interconnector members 104 connected thereto, which are included in the solar cell panel 100 shown in FIG. 11, as an unfolded state. FIG. 13 is a cross-sectional view schematically showing two solar cells 10 included in a solar cell string 102, which is included in a solar cell group 103 shown in FIG. 12, and connected to each other by an adhesive member 142 and a bypass diode 260 connected to the solar cell string 102 through an interconnector member 104 and a connecting member 304 as an unfolded state. For clarity and simplicity, a first electrode 42, a second electrode 44, an adhesive member 142, and a bypass diode 260 connected to the interconnector member 104 are not shown in FIG. 12.

In the embodiment, a plurality of solar cell strings 102 may be electrically connected in parallel by interconnector members 104 to form one solar cell group 103, which will be described later in more detail.

An interconnector member 104 may be electrically connected to an end of the solar cell string 102 (more specifically, an end of an end solar cell 10c or 10d positioned at the end of the solar cell string 102) to be connected to another solar cell string 102 or an outside (for example, an external circuit, as an example, a junction box). The interconnector members 104 may form a solar cell group 103 by connecting a plurality of solar cell strings 102 in parallel. However, embodiments of the invention are not limited thereto, and the interconnector member 104 may be connected to one solar cell string 102 so that one solar cell string 102 may form the solar cell group 103.

The interconnector member 104 includes a first interconnector 105 connected to an end of the solar cell string 102 or an end solar cells 10c or 10d positioned at the end of the solar cell string 102, and a second interconnector 106 having a separate structure from the first interconnector 105 and connected to the first interconnector 105. The first interconnectors 105 are positioned to correspond to the solar cell strings 102, respectively, and extend in a direction parallel to the solar cell string 102 (that is, in a first direction (an x-axis direction in the drawing) or a short axis direction of the solar cell 10) to an outside. The second interconnector 106 may include a portion extending in a second direction crossing (for example, perpendicular to) the extend direction of the solar cell string 102 (that is, the first direction or the short axis direction of the solar cell 10). In this instance, the second interconnector 106 may be arranged to connect at least a part of the plurality of solar cell strings 102 (that is, to be connected to the plurality of first interconnectors 105 corresponding to the plurality of solar cell strings 102), but embodiments of the invention are not limited thereto.

The first interconnectors 105 may be positioned at one end and the other end of each solar cell string 102, respectively. A first interconnector 105 may be connected to a first electrode 42 on a front surface of a solar cell 10 at one end of each solar cell string 102, and another first interconnector 105 may be connected to a second electrode 44 on a back surface of a solar cell 10 at the other end of each solar cell string 102. The two first interconnectors 105 positioned at both ends of the solar cell string 102 may extend in the first direction (the x-axis direction in the drawing) and protrude to an outside.

The second interconnector 106 may include a portion longitudinally extending in the second direction. For example, a first interconnector 105 is positioned on the front surface so as to be connected to the first electrode 42 in a first end solar cell 10c positioned at one end of each solar cell string 102, and another first interconnector 105 is positioned on the back surface so as to be connected to the second electrode 44 in a second end solar cell 10d positioned at the other end of each solar cell string 102. A second interconnector 106 is connected to the first interconnectors 105 connected to the first electrodes 42 of the first end solar cells 10c and protruding to one side, and another interconnector 106 is connected to the first interconnectors 105 connected to the second electrodes 44 of the second end solar cells 10d and protruding to the other side. The plurality of solar cell strings 102 may be connected to each other in parallel by the second interconnectors 106 to form one solar cell group 103. Any of various other structures may be applied to structures of the first and second interconnectors 105 and 106 and connection structure thereof.

The first and second interconnectors 105 and 106 may be folded along a bending line BL and be positioned on a back surface of a solar cell group 103, which will be described later in more detail.

In the embodiment, a plurality of solar cell groups 103 are connected in series to each other, and bypass diodes 260 are connected to solar cell groups 103 in parallel, respectively. This bypass diode 260 will be described in more detail with reference to FIGS. 14 to 17 together with FIGS. 11 to 13.

Figure 14:
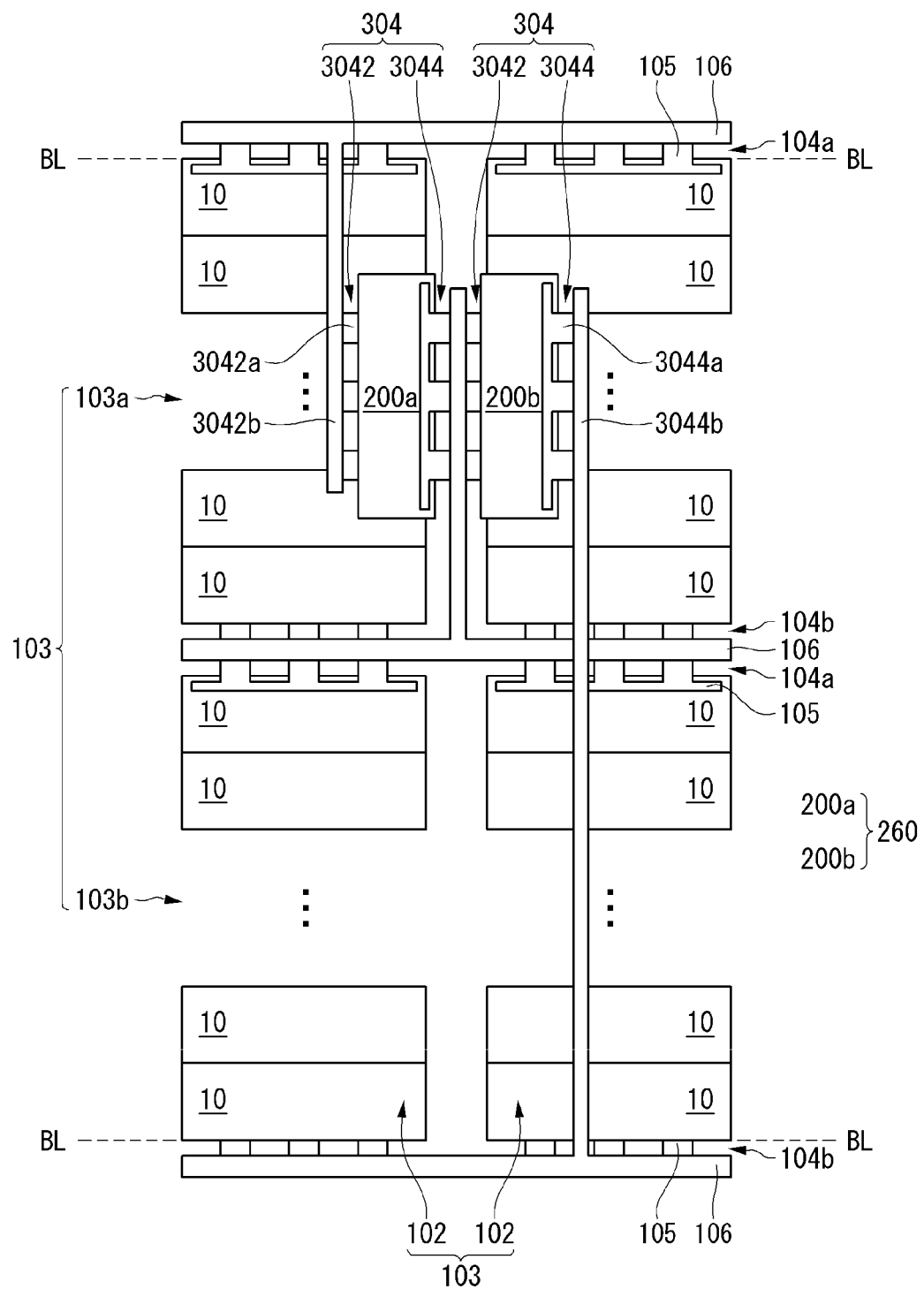
FIG. 14 is a back plan view schematically showing a plurality of solar cell groups, and interconnector members, connecting members, and bypass diodes connected thereto, which are included in the solar cell panel shown in FIG. 11, as an unfolded state.
Figure 15:
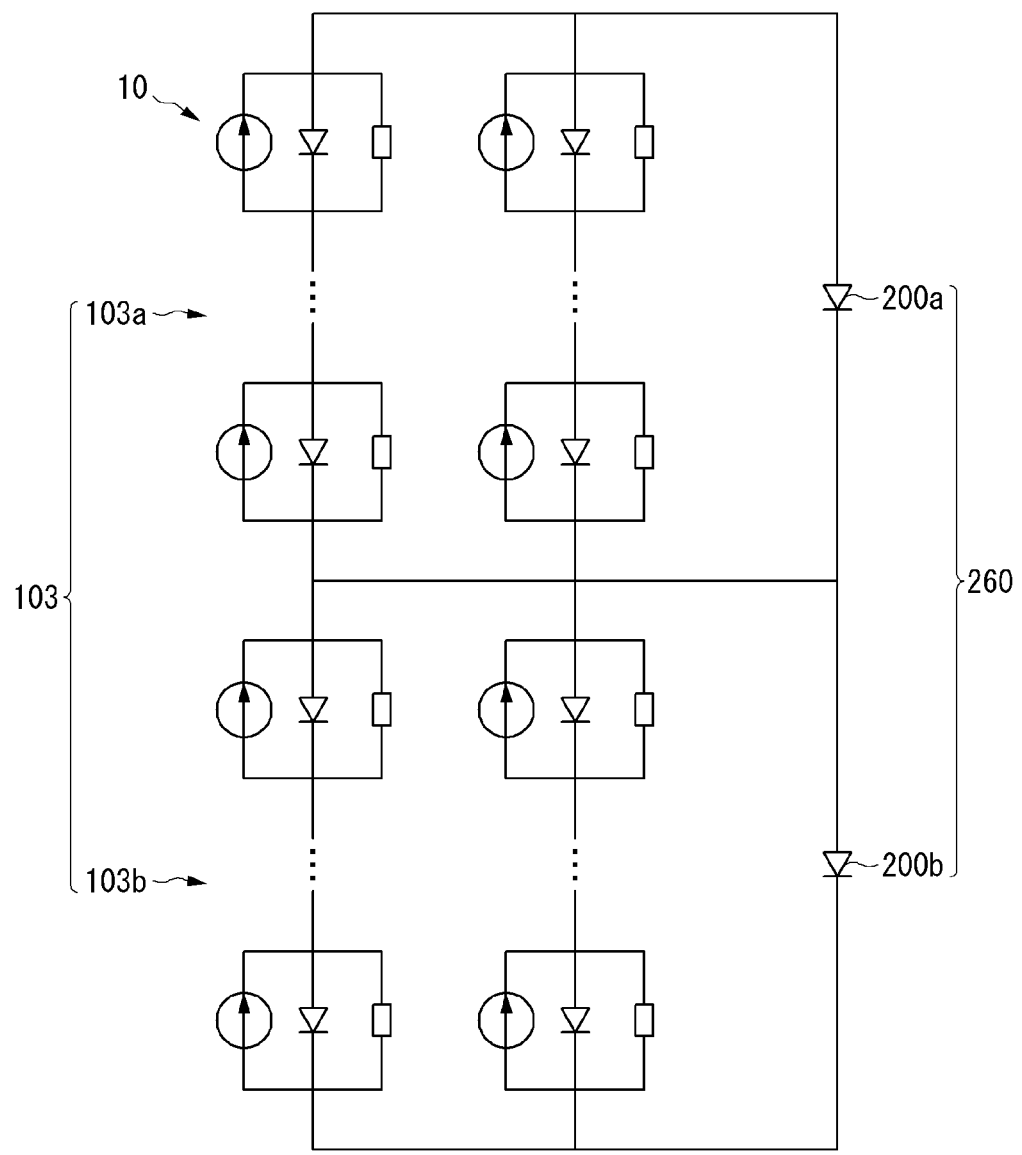
FIG. 15 is a schematic circuit diagram of a plurality of solar cell groups and bypass diodes connected thereto, which are shown in FIG. 14.
Figure 16:
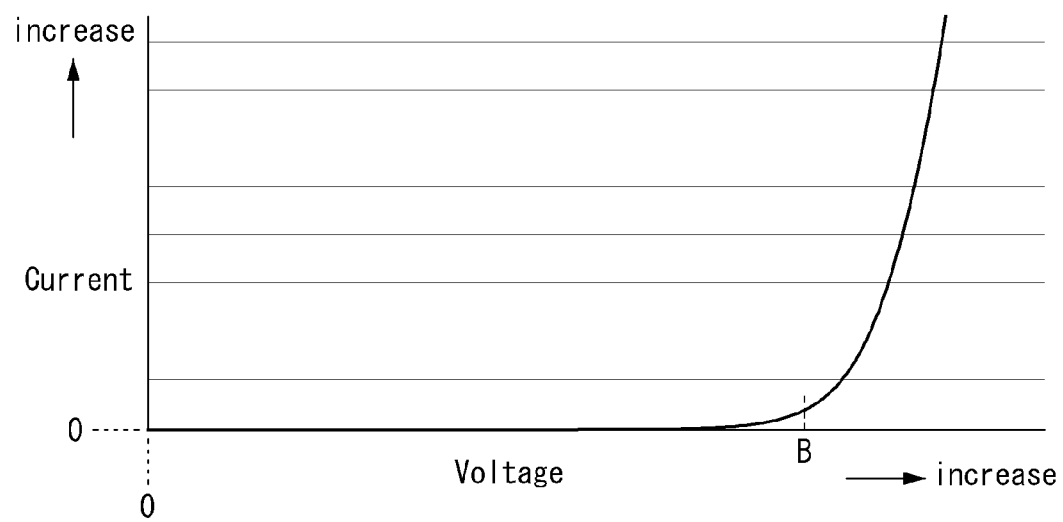
FIG. 16 is a current-voltage graph in a state where light is not incident to a bypass diode formed of a solar cell unit and included in a solar cell panel shown in FIG. 14.
Figure 17:
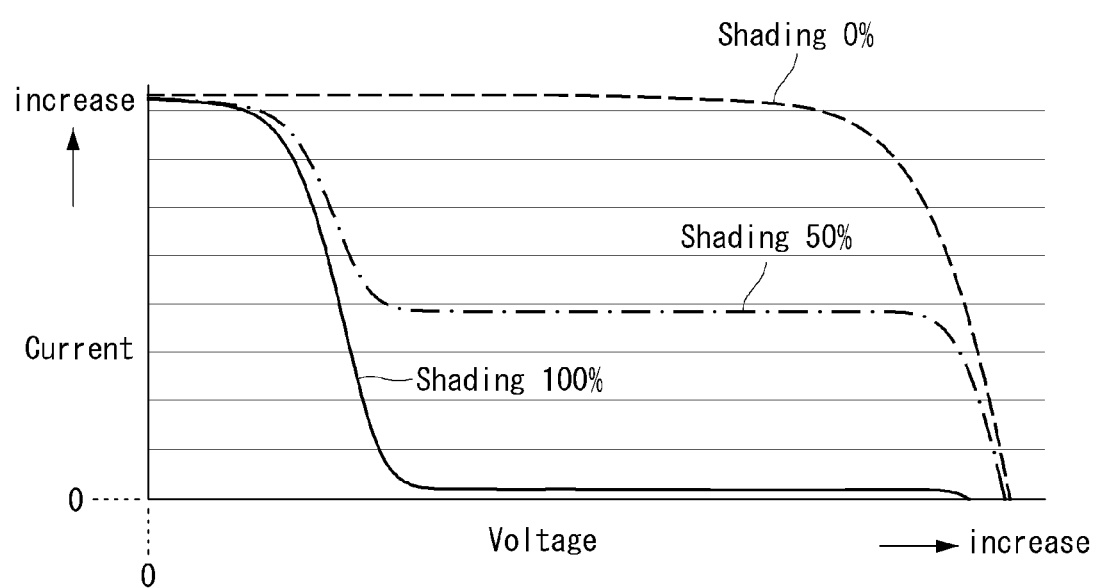
FIG. 17 is a current-voltage graph according to a ratio of a number of shaded solar cells in a state that a bypass diode formed of a solar cell unit and included in the solar cell panel shown in FIG. 14. is provided.

FIG. 14 is a back plan view schematically showing a plurality of solar cell groups 103, and interconnector members 104, connecting members 304, and bypass diodes 260 connected thereto, which are included in the solar cell panel 100 shown in FIG. 11, as an unfolded state. FIG. 15 is a schematic circuit diagram of a plurality of solar cell groups 103 and bypass diodes 260 connected thereto, which are shown in FIG. 14. FIG. 16 is a current-voltage graph in a state where light is not incident to a bypass diode formed of a solar cell unit and included in a solar cell panel shown in FIG. 14. FIG. 17 is a current-voltage graph according to a shading ratio (a ratio of a number of shaded solar cells) in a state that a bypass diode formed of a solar cell unit and included in the solar cell panel shown in FIG. 14. is provided.

Referring to FIG. 11 to FIG. 15, in the embodiment, the bypass diode 260 may be formed of a solar cell unit. For example, the bypass diode 260 may include a sub-semiconductor substrate 212 including a sub-base region 214 to correspond to the semiconductor substrate 12 of the solar cell 10, a first sub-conductive region 220 corresponding to the first conductive region 20 of the solar cell 10, and a second sub-conductive region 230 corresponding to the second conductive region 30 of the solar cell 10. The bypass diode 260 may further include first and second sub-electrodes 242 and 244, first and second sub-passivation layers 222 and 232, and a sub-anti-reflection layer 224, which correspond to the first and second electrodes 42 and 44, the first and second passivation layers 22 and 32, and the anti-reflection layer 24 of the solar cell 10, respectively. The description of the semiconductor substrate 12, the first and second conductive regions 20 and 30, the first and second electrodes 42 and 44, the first and second passivation layers 22 and 32, and the anti-reflection layer 24 of the solar cell 10 may be applied to the sub-semiconductor substrate 212, the first and second sub-conductive regions 220 and 230, the first and second sub-electrodes 242 and 244, the first and second sub-passivation layers 222 and 232, and the sub-anti-reflection layer 224 of the bypass diode 260 as they are, and thus, the detailed description thereto will be omitted. For example, the solar cell 10 and a solar cell unit of the bypass diode 260 may have the same structure (e.g., the same laminated structure and the same planar shape).

In this instance, the first conductive region 20 of the solar cell 10 included in the solar cell group 103 (for example, a first end solar cell 10c) and the first sub-conductive region 220 of the bypass diode 260 may be electrically connected to each other. The second conductive region 30 of the solar cell 10 included in the solar cell group 103 (for example, a second end solar cell 10d) and the second sub-conductive region 230 of the bypass diode 260 may be electrically connected to each other. In this instance, the solar cell 10 and the bypass diode 260 can be electrically connected to each other through an interconnector member 104 and a connecting member 304.

For example, the first conductive region 20 of the first end solar cell 10c and the first sub-conductive region 220 of the bypass diode 260 are electrically connected to each other through the first electrode 42, the interconnector member 104, the connecting member 304, and the first sub-electrode 242. The second conductive region 30 of the second end solar cell 10d and the second sub-conductive region 230 of the bypass diode 260 are electrically connected to each other through the second electrode 44, the interconnector member 104, the connecting member 304, and the second sub-electrode 244. The bypass diode 260 may be positioned at a non-light-incident region where sunlight is not incident.

Figure 13:
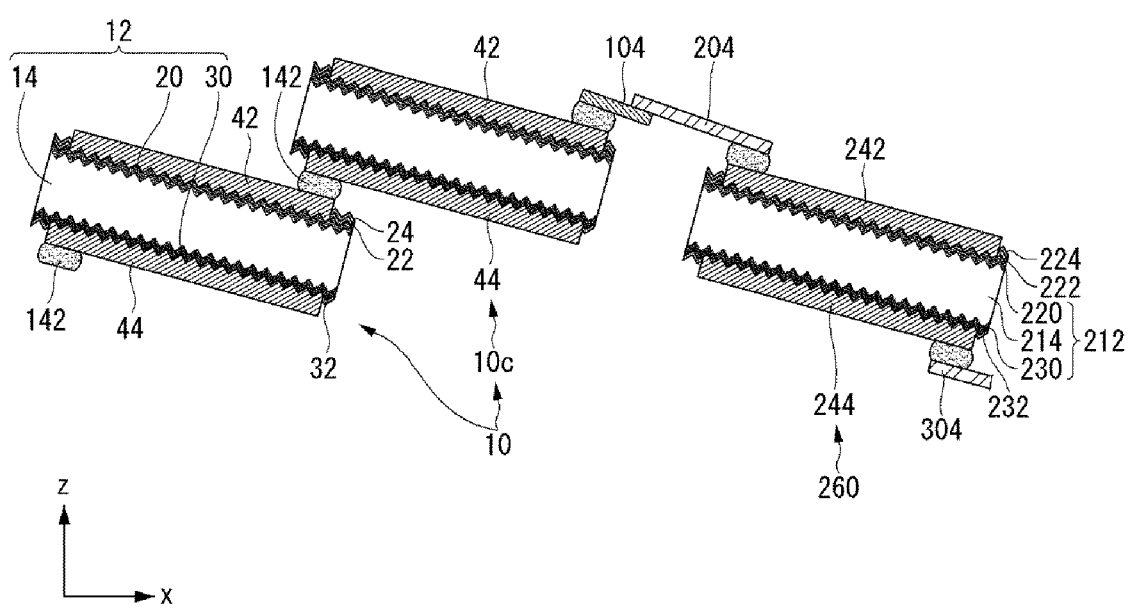
FIG. 13 is a cross-sectional view schematically showing two solar cells included in a solar cell string, which is included in a solar cell group shown in FIG. 12, and connected to each other by an adhesive member and a bypass diode connected to the solar cell string through an interconnector member and a connecting member as an unfolded state.

In FIGS. 11 and 13, it is exemplified that the interconnector member 104 and the connecting member 304 are formed of different bodies formed of separate members from each other, and then, they are bonded and fixed to each other. However, embodiments of the invention are not limited thereto. Thus, as shown in FIG. 14, at least parts of the interconnector member 104 and the connecting member 304 are formed of a single body so that a process for attaching and fixing at least a part of the interconnector member 104 and at least a part of the connecting member 304 may be omitted. Various other variations are possible.

The bypass diode 260 may serve as a diode connected in parallel to the solar cell group 103 for allowing a current to flow in a predetermined direction. That is, when light is incident to the solar cell 10, the current flows from an n-type region (for example, one of the first and second conductive regions 20 and 30) to a p-type region (for example, the other of the first and second conductive regions 20 and 30) by a photoelectric conversion. On the other hand, in the bypass diode 260 having the structure of the solar cell unit and positioned at the non-light-incident region, the current flows from the p-type region to the n-type region. Thus, the solar cells 10 operate normally, a voltage of a certain value or more is not applied to the bypass diode 260, the bypass diode 260 is turned off and thus current does not flow through the bypass diode 260. On the other hand, when at least one solar cell 10 does not operate normally due to shading, defect, or the like, a voltage of a certain value or more is applied to the bypass diode 260. A current that was to flow through the solar cell string 102 including the solar cell 10 which is not operated normally flows through the bypass diode 260. Thus, a hot spot or the like, which may generate when the current is concentrated to other solar cell string 102 or other solar cell group 103, can be prevented.

Referring to FIG. 16, the bypass diode 260 formed of the solar cell unit is turned at a certain voltage (that is, B in FIG. 16) or more, while the bypass diode 260 formed of the solar cell unit is turned off below the certain voltage. Therefore, the bypass diode 260 can sufficiently act as a diode. Referring to FIG. 17, the current is reduced as the shading ratio that is the ratio of the number of the shaded solar cells 10 increases in proportion to the shading ratio. Thus, it can be seen that the bypass diode 260 can sufficiently act as a diode to bypass the current that was to flow through the solar cell string 102 or the solar cell group 130 including the solar cell 10 which does not operate normally.

Accordingly, when the plurality of solar cell groups 103 are connected in series and some of solar cells 10 in one solar cell group 103 operate abnormally, the current is bypassed and flows through the bypass diode 260. In the case where each solar cell group 103 includes a plurality of solar cell strings 102 connected in parallel, when one solar cell 10 of one solar cell string 102 operates abnormally, thereby allowing the current to flow through the bypass diode 260 and preventing problems such as hot spots that may generate when the current is concentrated to other solar cell string 102. Accordingly, it is possible to effectively prevent the damage or the power degradation of the solar cell panel 100.

When the bypass diode 260 formed of the solar cell unit is positioned at the non-light-incident region, the bypass diode 260 can sufficiently act as a diode. Accordingly, a solar cell unit, which has an efficiency below a certain level, has a portion where a color has been changed, or has a portion being damaged or cracked and thus is determined to be defective, among a plurality of solar cells manufactured to be applied to the solar cell panel 100 may be used as the bypass diode 260 as it is. Even if a solar cell unit is determined to be defective because it does not satisfy a strict condition, the solar cell unit can sufficiently act as a diode to flow a current in a predetermined direction. Thus, if such a solar cell unit is used as the bypass diode 260, the effect by the bypass diode 260 formed of the solar cell unit can be achieved sufficiently. In the related art, the solar cell unit, which is determined to be defective, was not used as the solar cell 10 and thus was discarded. On the other hand, in the embodiment, a manufacturing cost corresponding to the bypass diode 260 can be reduced by using the solar cell unit as the bypass diode 260, and a connection structure between the solar cells 10 may be used as a connection structure between the solar cells 10 and the bypass diode 260 as it is and thus the connection structure can be simplified. In addition, the bypass diode 260 can be installed inside the solar cell panel 100 or attached or fixed to the solar cell panel 100. Accordingly, it is not necessary to provide a separate bypass diode positioned in a junction box, which is manufactured separately from the solar cell panel 100 in the related art, and thus, the structure can be maximally simplified. Thus, the manufacturing cost of the solar cell panel 100 can be reduced and the structure can be simplified by using the bypass diode 260 having a simple connection structure with the solar cell 10, low manufacturing cost, and excellent properties.

More specifically, a plurality of solar cell groups 103 may be connected in series by an interconnector member 104. Each solar cell group 103 may include a plurality of solar cell strings 102 spaced apart in a second direction and connected in parallel by an interconnector member 104.

In this instance, a first interconnector member 104a may be electrically connected to the first electrodes 42 or the first conductive regions 20 of the plurality of solar cell strings 102 at one side of the first solar cell group 103a, and a second interconnector member 104b may be electrically connected to the second electrodes 44 or the second conductive regions 30 of the plurality of solar cell strings 102 at the other side of the first solar cell group 103a. Also, a first interconnector member 104a may be electrically connected to the first electrodes 42 or the first conductive regions 20 of the plurality of solar cell strings 102 at one side of the second solar cell group 103b, and a second interconnector member 104b may be electrically connected to the second electrodes 44 or the second conductive regions 30 of the plurality of solar cell strings 102 at the other side of the second solar cell group 103b. In the drawing, it is exemplified that a second interconnector 106 corresponding to the second interconnector member 104b of the first solar cell group 103a and a second interconnector 106 corresponding to the first interconnector member 104a of the second solar cell group 103b may be one common second interconnector member 106 to simplify the structure. However, embodiments of the invention are not limited thereto. The second interconnector 106 corresponding to the second interconnector member 104b of the first solar cell group 103a and the second interconnectors 106 corresponding to the first interconnector member 104a of the second solar cell group 103b may be separately formed and a separate interconnector for connecting them may be positioned. Various other variations are possible.

To correspond to each of the bypass diodes 260 (that is, first and second bypass diodes 200a and 200b), the connecting member 304 may include a first connecting member 3042 and a second connecting member 3044. The connecting member 304 may electrically connect the first interconnector member 104a and a first sub-conductive region 220. The second connecting member 3044 may electrically connect the second interconnector member 104b and a second sub-conductive region 230. That is, in order to correspond to the first bypass diode 200a, a first connecting member 3042 may be electrically connected to the first interconnector member 104a of the first solar cell group 103a and a second connecting member 3044 may be electrically connected to a second interconnector member 104b of the first solar cell group 103a. That is, in order to correspond to the second bypass diode 200b, a first connecting member 3042 may be electrically connected to a first interconnector member 104a of a second solar cell group 103b and a second connecting member 3044 may be electrically connected to a second connecting member 104b of the second solar cell group 103b. The first bypass diode 200a and the second bypass diode 200b may be connected to each other in series.

More specifically, the first connecting member 3042 includes a first portion 3042a and a second portion 3042b. The first portion 3042a may include a first overlapped portion that overlaps the bypass diode 260 and a first connecting portion that protrudes outwardly therefrom and is connected to the second portion 3042b. The second portion 3042b may connect the first portion 3042a and the first interconnector member 104a to each other. For example, the first overlapped portion and the first sub-electrode 242 connected to the first sub-conductive region 220 in the bypass diode 260 may be fixed and connected (for example, physically and electrically connected) to each other by an adhesive member 142 positioned therebetween. The first portion 3042a and the second portion 3042b may be fixed to each other by soldering.

Similarly, the second connecting member 3044 includes a first portion 3044a and a second portion 3044b. The first portion 3044a may include a second overlapped portion that overlaps the bypass diode 260 and a second connecting portion that protrudes outwardly therefrom and is connected to the second portion 3044b. The second portion 3044b may connect the first portion 3044a and the second interconnector member 104b to each other. For example, the second overlapped portion and the second sub-electrode 244 connected to the second sub-conductive region 230 in the bypass diode 260 may be fixed and connected (for example, physically and electrically connected) to each other by an adhesive member 142 positioned therebetween. The first portion 3044a and the second portion 3044b may be fixed to each other by soldering.

According to this, a connecting area of the connecting member 304 and the bypass diode 260 can be sufficiently secured by the first and second overlapped portions, thereby improving a connection property. The first and second connecting portions, which are partially protruded and provided in plural, enable stable connection while reducing a material cost.

In the drawing, it is exemplified that the second portion 3044b of the second connecting member 3044 connected to the second interconnector member 104b of the first solar cell group 103a and the second portion 3042b of the first connecting member 3042 connected to the first interconnector member 104a of the second solar cell group 103b may be one common second portion to simplify the structure. However, embodiments of the invention are not limited thereto. Thus, a second portion 3044b of a second connecting member 3044 connected to a second interconnector member 104b of a first solar cell group 103a and a second portion 3042b of a first connecting member 3042 connected to a first interconnector member 104a of a second solar cell group 103b may be separately formed and a separate interconnector for connecting them may be positioned. Various other variations are possible.

In this instance, a portion of the interconnector member 104 may be folded or bent along the bending line BL. Then, a part of the interconnector member 104, the connecting member 304, and the bypass diode 260 may be positioned on the back surface of the solar cell group 103. Then, an area of a non-active area which is not directly involved in photoelectric conversion in the solar cell panel 100 can be minimized, an appearance of the solar cell panel 100 can be improved, and the bypass diode 260 can serve as a diode because the light may not be incident to the bypass diode 260. In this instance, when the bending line BL is positioned at connecting portions of the interconnector member 104, it can be easily folded along the bending line BL.

In this instance, an insulating layer 134 may be positioned between the solar cell group 103, and the bypass diode 260, the connecting member 304, and the interconnector member 104 to insulate them.

The insulating layer 134 may be formed to correspond to each of the bypass diode 260, the connecting member 304, and the interconnector member 104, or may be formed to correspond to an entire portion of the bypass diode 260, the connecting member 304, and the interconnector member 104. Also, the insulating layer 134 may have any of various other shapes. In this instance, the insulating layer 134 may have a transparent color or an opaque color that absorbs light so as to effectively prevent light from being incident on the bypass diode 260.

The insulating layer 134 may include any of various insulating materials (e.g., a resin) and may be formed in any of various forms or type, such as films, sheets, and the like. The insulating layer 134 may be formed separately from the interconnector member 104 or so on, and then, may be positioned between the solar cell group 103 and the bypass diode 260, the connecting member 304, the interconnector member 104, or so on when the interconnector member 104 is folded.

It is exemplified that the bypass diode 260, the connecting member 304, and the interconnector member 104 are positioned between the solar cell group 103 and the sealing member 130 in the drawing. However, at least one of the bypass diode 260, the connecting member 304, and the interconnector member 104 may be positioned on a back surface of the sealing member 130 and/or a back surface of the second cover member 120. In this instance, the insulating layer 134 may not be positioned and the sealing member 130 or the second cover member 102 may act as an insulating layer. In one example, the bypass diode 260 and the connecting member 304 may be attached to a back surface of the second cover member 120. Accordingly, since the bypass diode 260 is embedded or integrated into the solar cell panel 100, a separate structure (for example, a junction box) for receiving the bypass diode 260 may not be provided. Accordingly, a structure of the solar cell panel 100 can be greatly simplified. Various other variations are possible.

For example, the connecting member 304, the first interconnector 105, and/or the second interconnector 106 may include a core layer and a solder layer formed on a surface of the core layer. The core layer may include any of various metals, and the solder layer may include any of various solder materials. For example, the solder layer may include Sn, SnAgCu, SnPb, SnBiCuCo, SnBiAg, SnPbAg, SnAg, SnBi or SnIn. According to this, a connection of the connecting member 202, and/or a connection of the first interconnector 105 and the second interconnector 106 may be formed by soldering. Then, the connecting member 304, and/or the first interconnector 105 and the second interconnector 106 can be connected in a simple process at a low temperature to have good electrical properties.

According to the embodiment, the bypass diode 260 having a simple structure, manufactured by a low manufacturing cost, and having excellent properties are included, and thus, a manufacturing cost of the solar cell panel 100 can be reduced and a structure of the solar cell panel 100 can be simplified. Also, a separate junction box including the bypass diode 260 can be omitted, thereby greatly simplifying a structure of a solar cell module including the solar cell panel 100.

Figure 18:
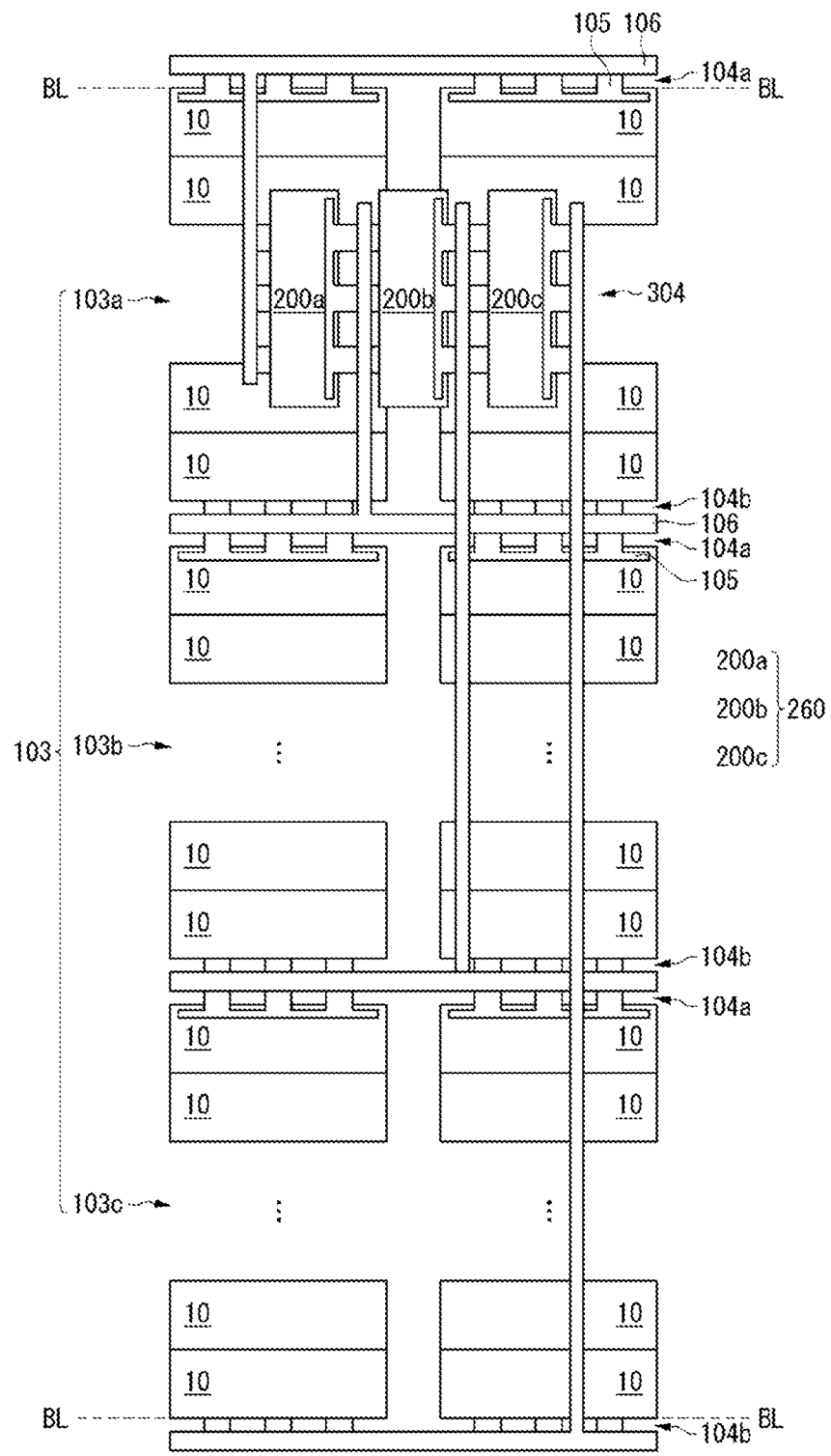
FIG. 18 is a back plan view schematically showing a plurality of solar cell groups, interconnector members, connecting members, and bypass diodes connected thereto, which are included in a solar cell panel according to yet still another embodiment of the invention, as an unfolded state.

In the above description and related drawings, it is exemplified that a plurality of solar cell groups 103 include first and second solar cell groups 103a and 103b. However, embodiments of the invention are not limited thereto. As another embodiment, as shown in FIG. 18, a plurality of solar cell groups 103 may include a third solar cell group 103c, which is connected to a second solar cell group 103b in series, in addition to the first and second solar cell groups 103a and 103b. Then, a bypass diode 260 may include first to third bypass diodes 200a, 200b, and 200c connected in parallel to the first to third solar cell groups 103a, 103b and 103c, respectively. The descriptions of the first or second solar cell groups 103a and 103b and the first or second bypass diodes 200a and 200b may be applied to the third solar cell group 103c and the third bypass diode 200c, and thus, the detailed description thereof will be omitted. Embodiments of the invention are not limited thereto, and a plurality of solar cell groups 103 may include four or more solar cell groups.

In the above description, each of the plurality of bypass diodes 260 are formed of a solar cell unit, but embodiments of the invention are not limited thereto. Accordingly, at least one of the plurality of bypass diodes 260 may be formed of a solar cell unit.

In the above description and drawings, it is exemplified that the solar cell 10 has a cut-cell structure having a long axis and a short axis and adjacent solar cells 10 are connected by the overlap area OP and the adhesive member 142, and the bypass diode 260 has a cut-cell structure having a long axis and a short axis. According to this, the solar cell 10 and the bypass diode 260 can have substantially the same area. The substantially the same area may mean areas having an error of less than 10%, or an area difference due to existence or absence of inclined portions.

However, embodiments of the invention are not limited thereto. The solar cell 10 may be formed of a mother solar cell which is not cut. In this instance, the bypass diode 260 may have a cut-cell structure, or may be formed of a mother solar cell that is not cut. For example, a solar cell unit constituting the bypass diode 260 may have an area substantially the same as or smaller than that of the solar cell 10. However, embodiments of the invention are not limited thereto and various other modifications are possible.

Figure 19:
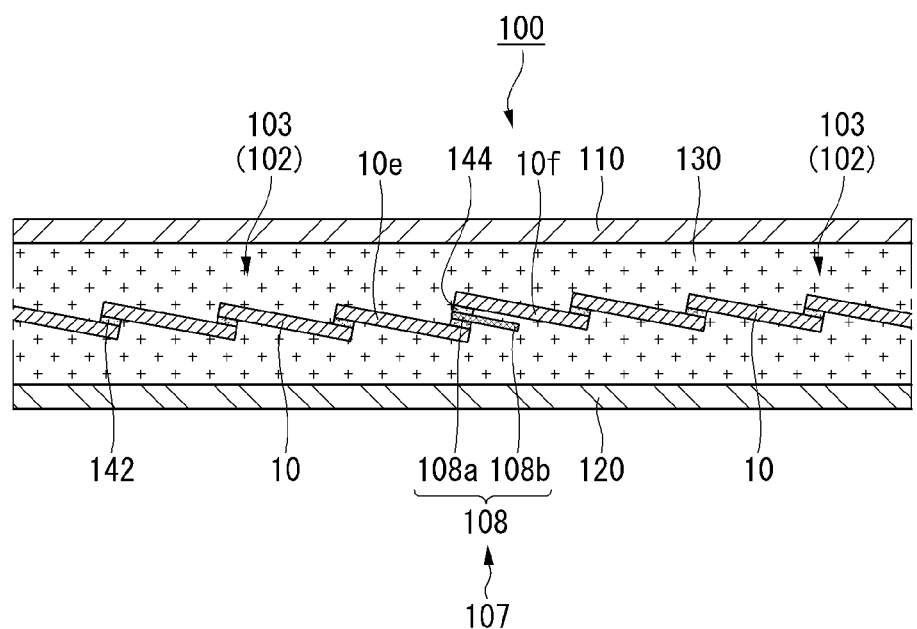
FIG. 19 is a cross-sectional view showing a solar cell panel according to yet still another embodiment of the invention.
Figure 20:
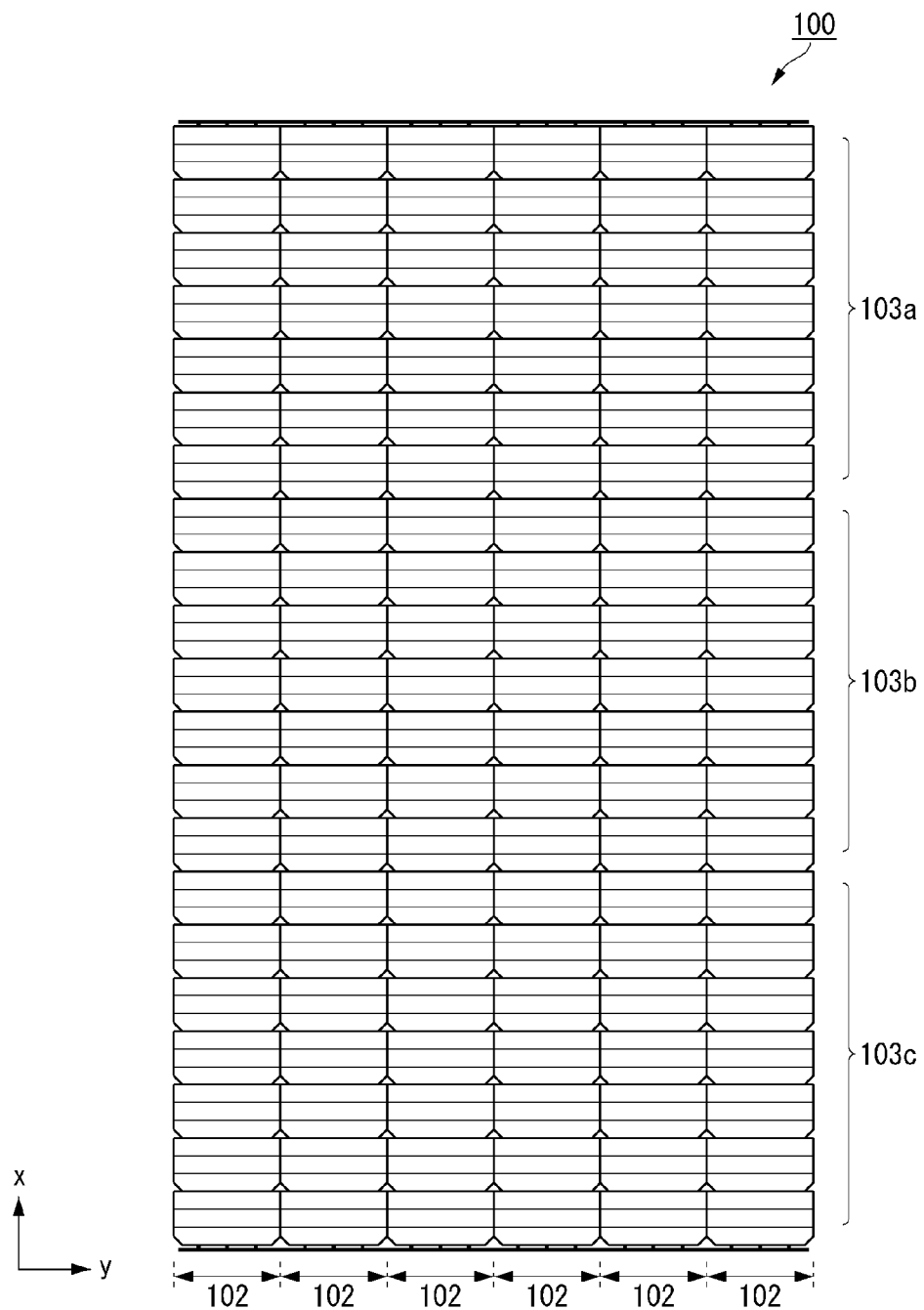
FIG. 20 is a plan view schematically showing solar cells forming a plurality of solar cell groups, which are included in the solar cell panel shown in FIG. 19.
Figure 21:
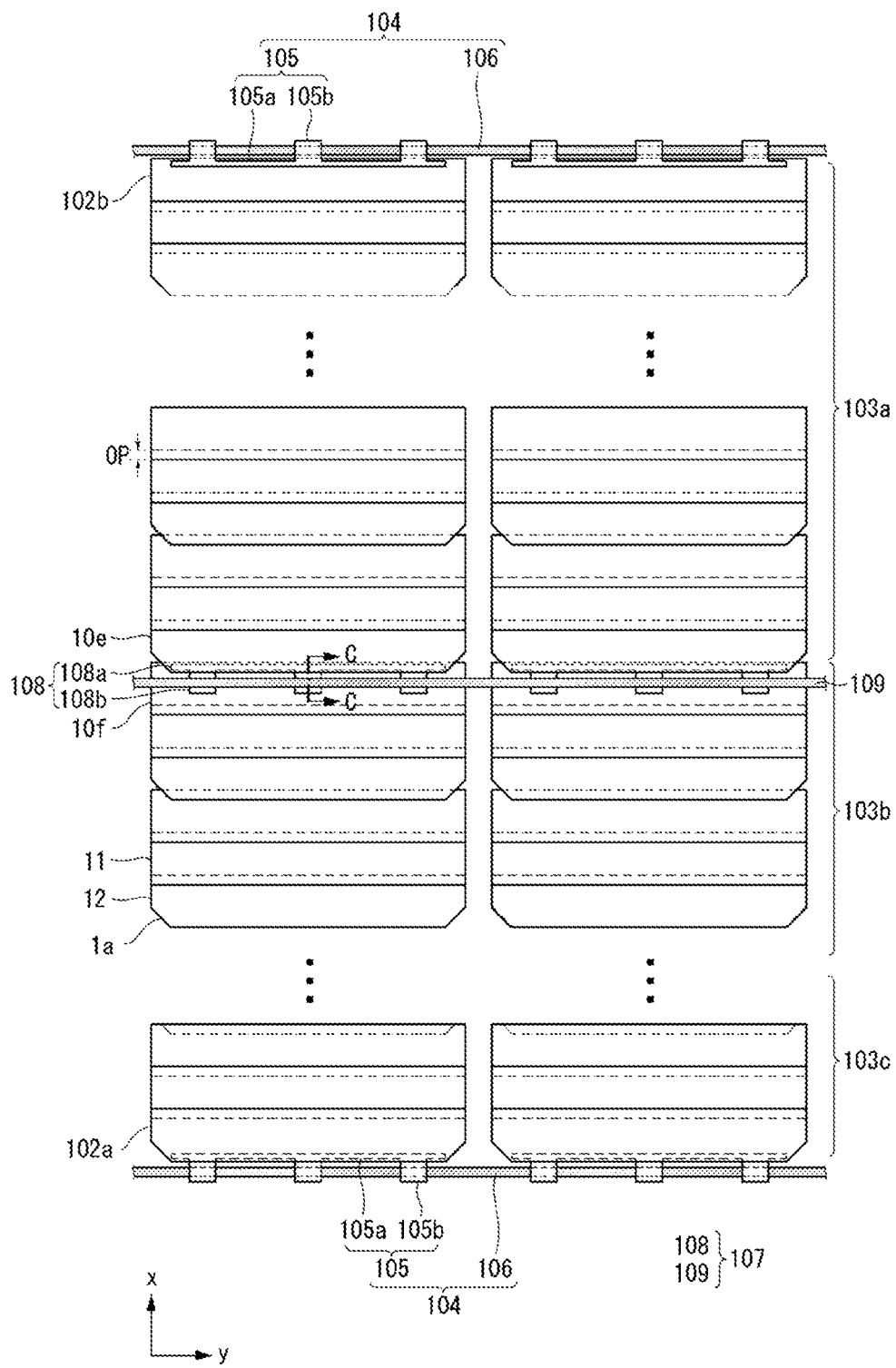
FIG. 21 is a partial back plan view showing two solar cell strings, and an interconnector member and an intermediate interconnector member for connecting the two solar cell strings, which are included in the solar cell panel shown in FIG. 19.
Figure 22:
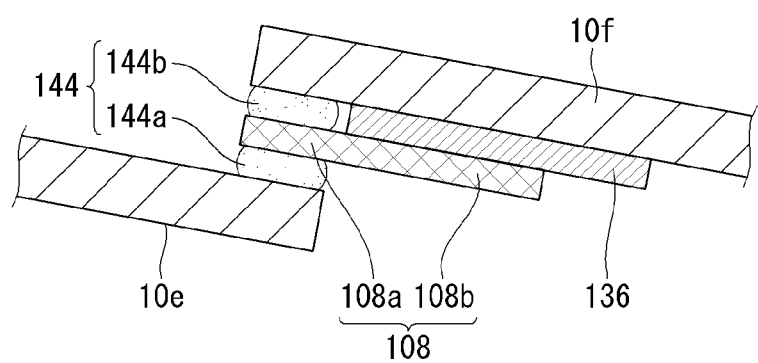
FIG. 22 is a cross-sectional view taken along line C-C of FIG. 21.

FIG. 19 is a cross-sectional view showing a solar cell panel according to yet still another embodiment of the invention, and FIG. 20 is a plan view schematically showing solar cells forming a plurality of solar cell groups, which are included in the solar cell panel shown in FIG. 19. FIG. 21 is a partial back plan view showing two solar cell strings, and an interconnector member and an intermediate interconnector member for connecting the two solar cell strings, which are included in the solar cell panel shown in FIG. 19. FIG. 22 is a cross-sectional view taken along line C-C of FIG. 21.

Referring to FIGS. 19 to 22, in the embodiment, a solar cell string 102 in which a plurality of solar cells 10 are connected in series may include a plurality of solar cell groups 103 (for example, first to third solar cell groups 103a, 103b, and 103c), and one or more solar cell strings 102 may be provided. Alternatively, a plurality of solar cell groups 103 connected in series may be provided, and each solar cell group 103 may include one or a plurality of solar cell strings 102. For example, a plurality of solar cells 10 forming the solar cell string 102 may be connected (e.g., connected in series) to each other in a first direction (an x-axis direction) or in a short axis direction of the solar cell 10. A plurality of solar cell strings 102 may be connected in a second direction (an y-axis direction in the drawings) crossing the first direction or in a long axis direction of the solar cell 10. A plurality of solar cell groups 103 may be connected (e.g., connected in series) to each other in the first direction, and a plurality of solar cell strings 102 included in each solar cell group 103 may be connected (e.g., connected in parallel) to each other in the second direction.

In the embodiment, each of a plurality of solar cells 10 in each solar cell string 102 may have a long axis and a short axis. In this instance, adjacent solar cells 10 have an overlap area OP, and an adhesive member 142 is positioned between the adjacent solar cells 10 at the overlap area OP to connect the adjacent solar cells 10 to each other.

The plurality of solar cell strings 102 connected in the second direction may be connected in parallel by an interconnector member 104 and/or an intermediate interconnector member 107.

The interconnector members 104 may be positioned at both ends of the solar cell string 102, respectively. In one example, the interconnector members 104 includes first interconnectors 105 that are disposed to overlap one sides of end solar cells 102a and 102b, which are positioned at both ends of the solar cell string 102, respectively. The interconnector members 104 may further include second interconnectors 106, each extending in a second direction for connecting the first interconnectors 105 included in the plurality of adjacent solar cell strings 102.

For a structure and a shape of an overlapped portion 105a and a connecting portion 105b of the first interconnector 105, and the second interconnector 106, the descriptions of the overlapped portion 105a and the connecting portion 105b of the first interconnector 105, and the second interconnector 106 in the above embodiments may be applied as they are, and their detailed descriptions will be omitted.

In this instance, one first interconnector 105 may be connected to a first electrode 42 (for example, a first bus bar electrode 42b) of a first end solar cell 102a of a solar cell string 102 or a plurality of solar cell groups 103, and the other first interconnector 105 may be connected to a second electrode 44 (for example, a second bus bar electrode 44b) of a second end solar cell 102b of the solar cell string 102 or the plurality of solar cell groups 103. In this instance, an adhesive member 142 may be positioned between the first electrode 42 (for example, the first bus bar electrode 42b) of the first end solar cell 102a and one first interconnector 105 (for example, an overlapped portion 105a) to electrically and physically connect them. Similarly, an adhesive member 142 may be positioned between the second electrode 44 (for example, the second bus bar electrode 44b) of the second end solar cell 102b and the other first interconnector 105 (for example, an overlapped portion 105a) to electrically and physically connect them.

In the embodiment, an intermediate interconnector member 107 may be a member (for example, a bypass member) positioned at an intermediate region of the solar cell string 102 to be connected to a bypass diode BD (see FIG. 24) (for example, a bypass member). In this instance, the intermediate region may include a region where a solar cell 10 excluding the first and second end solar cells 102a and 102b is positioned in the solar cell string 102. Two adjacent solar cell groups 103 are defined with respect to the intermediate interconnector member 107.

The intermediate interconnector member 107 is a portion drawn out or protruding from an intermediate region of the solar cell string 102 and connected to an intermediate region of another solar cell string 102 and/or a bypass diode BD. In one example, the intermediate interconnector member 107 may connect a plurality of solar cell strings 102 adjacent to in a second direction at intermediate regions. The intermediate interconnector member 107 may electrically connect solar cell groups 103 (or first and second intermediate solar cells 10e and 10f included therein) adjacent to each other in a first direction, and may electrically and physically connect a plurality of solar cell strings 102 adjacent to each other in a second direction and connected in parallel to each other. Further, the intermediate interconnector members 107 may connect the solar cell group 103 to the bypass diode BD, respectively, so that current is bypassed and flows through the bypass diode BD when there is a solar cell 10 that operates abnormally, thereby prevent problems such as a hot spot that may be generated when current is concentrated.

Hereinafter, it will be described mainly based on a first intermediate solar cell 10e included in one solar cell group 103 and a second intermediate solar cell 10f included in another solar cell group 103 adjacent to the one solar cell group 103, and an intermediate interconnector member 107 between the first intermediate solar cell 10e and the second intermediate solar cell 10f to connect the first intermediate solar cell 10e and the second intermediate solar cell 10f.

In the embodiment, the intermediate interconnector member 107 may include a first member 108 formed to correspond to each solar cell string 102 and a second member 109 connected to the first member 108 and extending to an outside of the solar cell string 102.

More specifically, the first member 108 may include an overlapped portion 108a and an outer portion 108b. The overlapped portion 108a may be disposed between the first and second intermediate solar cells 10e and 10f that are adjacent to each other while interposing the intermediate interconnector member 107 at an overlap area OP of the first and second intermediate solar cells 10e and 10f. The outer portion 108b may extend from the overlapped portion 108a and may be positioned outside the overlap area OP. In this instance, the outer portion 108b may extend or protrude in a direction crossing the overlapped portion 108a to overlap the solar cell string 102 at the back surface of the solar cell string 102. Each first member 108 may be provided so as to correspond to each solar cell strings 102, and thus, a plurality of first members 108 may be provided so as to correspond to the plurality of solar cell strings 102, respectively.

The second member 109 may extend to an outside of the solar cell string 102 in a second direction crossing the solar cell string 102 and may be connected to the outer portion 108b. For example, the second member 109 may longitudinally extend in the second direction to connect (e.g., connect in parallel) a plurality of first members 108 provided to correspond to the plurality of solar cell strings 102, respectively. More specifically, the second member 109 may have a generally bar shape extending in the second direction, and may be connected to the plurality of outer portions 108b of the plurality of first members 108. For example, the first member 108 and the second member 109 may be connected by soldering or the like. Then, the first member 108 and the second member 109 can be electrically and physically connected stably by a simple process. However, embodiments of the invention are not limited thereto.

In one example, the first member 108 may have a structure or a shape the same as or similar to that of the first interconnector 105. Then, the first member 108 and the first interconnector 105 may be formed of interconnectors of the same or similar shape to simplify a manufacturing process and a structure. Similarly, the second member 109 may have a structure or a shape the same as or similar to that of the second interconnector 106. Then, the second member 108 and the second interconnector 106 may be formed of interconnectors of the same or similar shape to simplify a manufacturing process and a structure. However, embodiments of the invention are not limited thereto, and the first member 108 and the first interconnector 105, and the second member 109 and the second interconnector 106 may have different structures or shapes.

In this instance, the overlapped portion 108a may be positioned between the first intermediate solar cell 10e and the second intermediate solar cell 10f at the overlap area OP of the first intermediate solar cell 10e and the second intermediate solar cell 10f. The overlapped portion 108a may have a bar shape having a small width in the first direction and extending in the second direction to correspond to the shape of the overlap area OP.

In this instance, the overlapped portion 108a may be positioned between a first electrode 42 (for example, a first bus bar electrode 42b) of the first intermediate solar cell 10e and a second electrode 44 (for example, a second bus bar electrode 44b) of the second intermediate solar cell 10f. The first electrode 42 of the first intermediate solar cell 10e and one surface (for example, a back surface) of the first member 108, and the second electrode 44 of the second intermediate solar cell 10f and one surface (for example, a front surface) of the first member 108 may be connected by an attaching member 143. In one example, the attaching member 143 may be formed of an electrical conductive adhesive (ECA), a solder, or the like. More specifically, the attaching member 143 may include a first attaching member 143a and a second attaching member 143b. The first attaching member 143a may be positioned between (for example, be in contact with) the first electrode 42 of the first intermediate solar cell 10e and one surface (for example, a back surface) of the first member 108. The second attaching member 143b may be positioned between (for example, be in contact with) the second electrode 44 of the second intermediate solar cell 10f and the other surface (for example, a front surface) of the first member 108. The first and second bonding members 143a and 143b may be formed of an electrical conductive adhesive, and may be formed of the same material as the adhesive member 142 as an example.

In a portion where the intermediate interconnector member 107 is not provided, one adhesive member 142 is disposed between a first solar cell and a second solar cell adjacent to each other, or between the end solar cell 102a or 102b and the interconnector member 104. On the other hand, in a portion where the intermediate interconnector member 107 is provided, the first and second attaching member 143a and 143b are provided. Accordingly, connection structures, attaching structures, fixing structures, or the like of the solar cells 10 in the portion where the intermediate interconnector member 107 is not provided and in the portion where the intermediate interconnector member 107 is provided may be different from each other.

The outer portion 108b may extend in the first direction from the overlapped portion 108a. A width of the outer portion 108b in the second direction may be greater than a width of the overlapped portion 108a in the first direction. A plurality of outer portions 108b may be provided at regular intervals in the second direction to reduce a total area of the outer portion 108b and improve stability of connection with the second member 109. However, embodiments of the invention are not limited thereto, and a number, a size, an arrangement, etc. of the outer portion 108b may be varied in consideration of connection, contact resistance, or the like with the second member 109.

The overlapped portion 108a of the first member 108 is positioned between the first and second intermediate solar cells 10e and 10f at the overlap area OP and the outer portion 108b is positioned at the back surface of the solar cell string 102. Also, the second member 109 is visible from a front side only between the solar cell strings 102 in the second direction. In other words, a portion of the intermediate interconnector member 107 excluding a portion positioned between the solar cell strings 102 is positioned invisible from the front side, and a portion that the solar cells 10 or the solar cell groups 103 are spaced apart from each other in the first direction does not exist. The portion between the solar cell strings 102 in the second direction does not contribute to photoelectric conversion, and thus, even if the intermediate interconnector member 107 is provided between the solar cell strings 102 in the second direction, it does not interfere with the photoelectric conversion. Accordingly, even when the intermediate interconnector member 107 is provided, there is no space between the solar cell 10 or the solar cell group 103 in the first direction, thereby preventing output of the solar cell panel 100 from being lowered.

In this instance, an insulating layer 136 may be positioned between at least a portion of the interconnector member 107 except for the overlap area OP and a back surface of the solar cell string 102 to insulate them. In the embodiment, the insulating layer 136 may be positioned between at least a part of the outer portion 108b overlapping the solar cell string 102 and the back surface of the solar cell string 102. The insulating layer 136 may be formed to correspond to each outer portion 108b of the first member 108, or may be formed to correspond to a plurality of outer portions 108b of the first member 108, or may be formed to correspond to an entire portion of a plurality of outer portions 108b of first members 108 positioned at a plurality of solar cell strings 102. Also, the insulating layer 136 may have any of various other shapes. The insulating layer 136 may include any of various insulating materials (e.g., a resin) and may be formed in any of various forms or type, such as films, sheets, and the like. The insulating layer 136 may be formed separately from the intermediate interconnector member 107 and then may be positioned between the intermediate interconnector member 107 and the solar cell string 102.

By the interconnector member 104 and/or the intermediate interconnector member 107, a plurality of solar cell strings 102 may be connected in parallel. For example, a plurality of solar cell groups 103 may be connected in series, and each solar cell group 103 may include a plurality of solar cell strings 102. As a result, the solar cell strings 102 are formed of a plurality of solar cell groups 103, and current can flow through a bypass path when the solar cell 10 operates abnormally in one solar cell string 102 included in one solar cell group 103. This will be described in more detail with reference to FIGS. 23 and 24.

Figure 23:
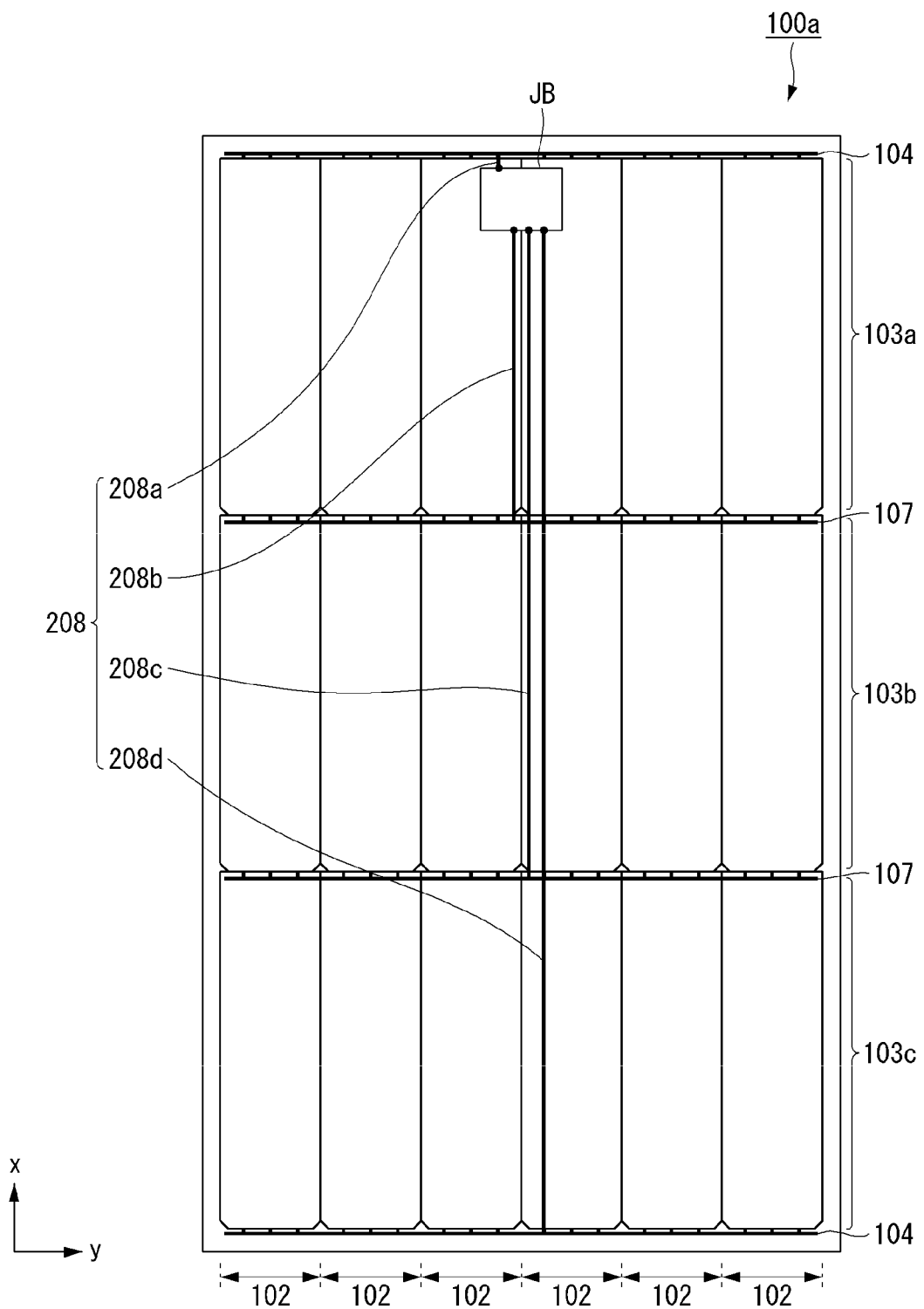
FIG. 23 is a back plan view schematically showing a back surface of a solar cell module including the solar cell panel shown in FIG. 19.
Figure 24:
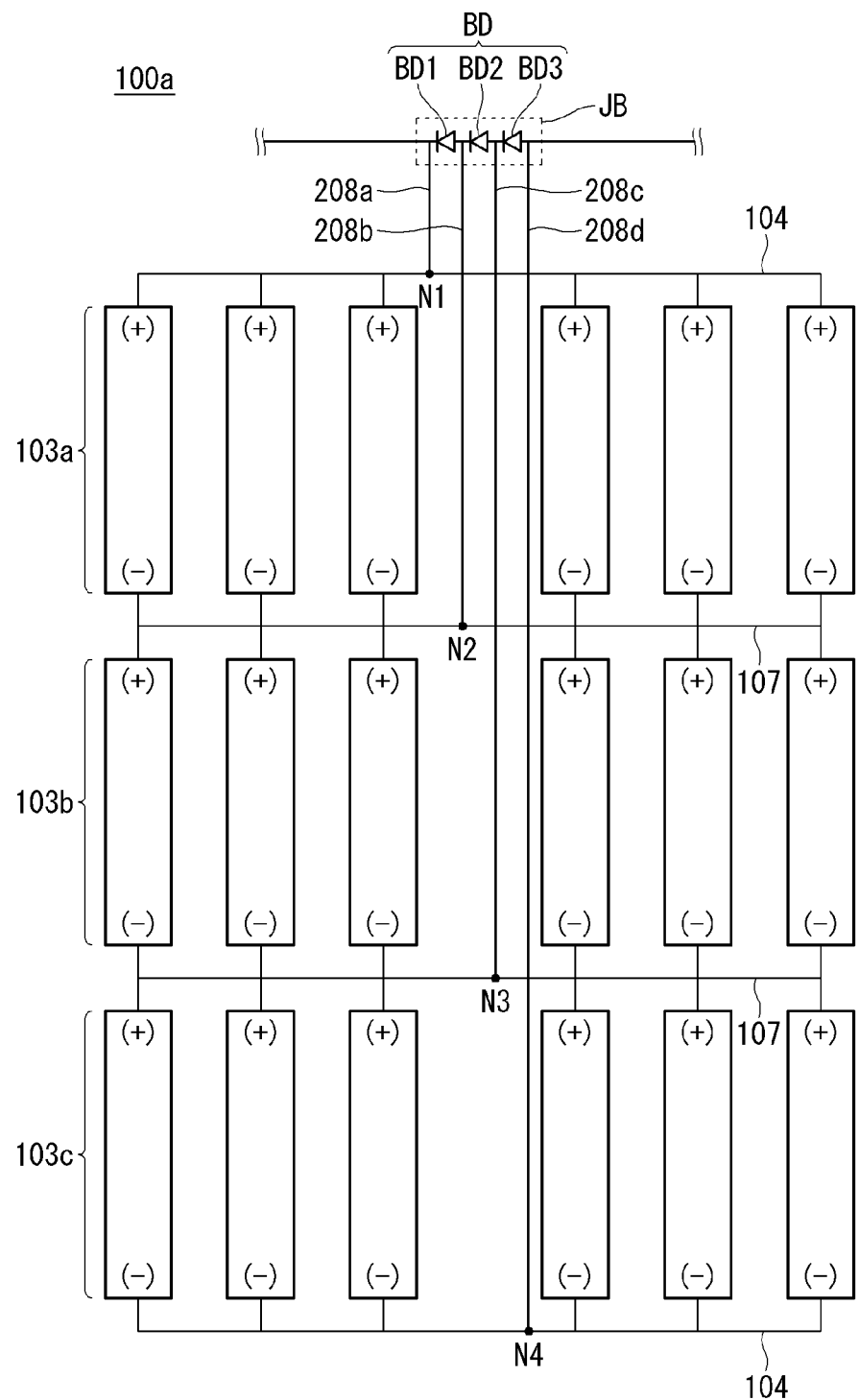
FIG. 24 is a diagram showing an equivalent circuit of the solar cell module shown in FIG. 23.

FIG. 23 is a back plan view schematically showing a back surface of a solar cell module including the solar cell panel shown in FIG. 19. FIG. 24 is a diagram showing an equivalent circuit of the solar cell module shown in FIG. 23.

Referring to 23 and 24, a solar cell module 100a according to the embodiment includes a solar cell panel 100, and a wiring box JB (for example, a junction box) disposed on a back surface of the solar cell panel 100 and including a bypass diode BD embedded in the wiring box JB. In this instance, the bypass diode BD may include a plurality of bypass diodes BD corresponding to a plurality of solar cell groups 103, respectively.

In FIGS. 19 to 24, it is exemplified that a plurality of solar cell groups 103 include first to third solar cell groups 103a, 103b and 103c, two intermediate interconnector member 107 each positioned between neighboring solar cell groups 103 are provided, and six solar cell strings 102 are provided in each solar cell group 103. However, this is just an example, and a number of the solar cell groups 103, a number of the intermediate interconnector members 107, and a number of the solar cell strings 102 may be variously modified.

A number of solar cells 10 constituting each solar cell string 102 included in each solar cell group 103 may be 4 to 60. Within a range, effect of the intermediate interconnector member 107 can be maximized. However, this is just for an example, and the number of solar cells 10 constituting the solar cell string 102 included in each solar cell group 103 may be variously modified.

In the embodiment, the intermediate interconnector member 107 and the bypass diode BD of the wiring box JB may be connected by a connecting member 208.

More specifically, a first connecting member 208a connects between an anode of a first bypass diode BD1 and an interconnector member 104 positioned at one end, and connects the interconnector member 104 to the first bypass diode BD1 through a first node N1.

One side of a second connecting member 208b is connected to a second node N2 commonly connected to the first solar cell group 103a and the second solar cell group 103b (that is, an intermediate interconnector member 107 positioned between first and second intermediate solar cells 10e and 10f included in the first solar cell group 103a and the second solar cell group 103b). Another side of second connecting member 208b is commonly connected to a cathode of the first bypass diode BD1 and an anode of a second bypass diode BD2. A bypass path of the first solar cell group 103a is formed by the first and second connecting members 208a and 208b.

One side of a third connecting member 208c is connected to a third node N3 commonly connected to the second solar cell group 103b and the third solar cell group 103c (that is, an intermediate interconnector member 107 positioned between first and second intermediate solar cells 10e and 10f included in the second solar cell group 103b and the third solar cell group 103c). Another side of third connecting member 208c is commonly connected to a cathode of the second bypass diode BD2 and an anode of a third bypass diode BD3. A bypass path of the second solar cell group 103b is formed by the second and third connecting members 208b and 208c.

A fourth connecting member 208d connects between an interconnector member 104 positioned at the other end and a cathode of the third bypass diode BD3, and connects the interconnector member 104 to the third bypass diode BD3 through a fourth node N4. A bypass path of the third solar cell group 103c is formed by the third and fourth connecting members 208c and 208d.

The connecting member 208 and the interconnector member 104, or the connecting member 208 and the intermediate interconnector member 107 may be connected by soldering, an electrical conductive adhesive, or the like. A manufacturing process can be simplified when the connecting member 208 and the interconnector member 104, or the connecting member 208 and the intermediate interconnector member 107 may be connected by soldering.

In the embodiment, the interconnector member 104, the intermediate interconnector member 107, the connecting member 208, or the like may include a core layer and a solder layer formed on a surface of the core layer. For example, the interconnector member 104, the intermediate interconnector member 107, the connecting member 208, or the like may be formed of a bus ribbon having a rectangular cross-section having a width greater than a thickness. However, stability of a connection structure can be improved. However, embodiments of the invention are not limited thereto.

The core layer may include any of various metals, and the solder layer may include any of various solder materials (for example, tin (Sn), lead (Pb), or an alloy including the same). For example, the solder layer may include Sn, SnAgCu, SnPb, SnBiCuCo, SnBiAg, SnPbAg, SnAg, SnBi or SnIn. According to this, a connection can be formed by a simple method such as soldering. Therefore, a connection of the connecting member 208 and the interconnector member 104, and/or a connection of the connecting member 208 and the intermediate interconnector member 107 may be formed by soldering. Then, they can be connected by a simple process at a low temperature to have good electrical properties.

Alternatively, the interconnector member 104, the intermediate interconnector member 107, the connecting member 208, or the like may be formed of a conductive film including an insulating member and conductive particles distributed in the insulating member. However, embodiments of the invention are not limited thereto and various modifications are possible.

In FIGS. 23 and 24 and in the above description, it is exemplified that the connecting member 208 for connecting the bypass diode BD with the interconnector interconnector member 104 and/or the intermediate interconnector member 107 is a separate member from the interconnector member 104 and/or the intermediate interconnector member 107. However, embodiments of the invention are not limited thereto. The interconnector member 104 and/or the intermediate interconnector member 107 may be directly connected to the bypass diode BD of the wiring box JB without a separate connecting member 208. For example, a part of the interconnector member 104 and/or a part of the intermediate interconnector member 107 (as an example, a part of a second interconnector 106 and/or a part of the second member 109) and the connecting member 208 may formed of a single body having an integrate structure.

Each connecting member 208 may extend from the interconnector member 104 or the intermediate interconnector member 107 in a first direction, and a plurality of connecting members 208 may be arranged in parallel. In FIGS. 23 and 24, the wiring box JB is positioned adjacent to one side (an upper side in FIGS. 23 and 24) of the solar cell string 102, and lengths of the first connecting member 208a, the second connecting member 208b, the third connecting member 208c, and the fourth connecting member 208b increases as it goes the first connecting member 208a, the second connecting member 208b, the third connecting member 208c, and the fourth connecting member 208b. However, a position of the wiring box JB may be changed, and a length, a shape, or the like of the plurality of connecting members 208 may be variously modified.

Figure 25:
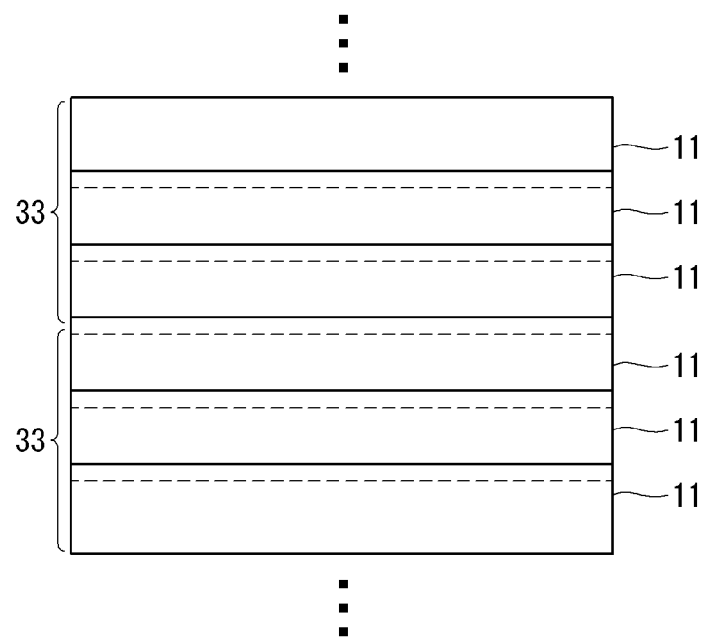
FIG. 25 is a partial plan view showing an example of a plurality of solar cells included in a solar cell panel according to a modified embodiment of the invention.

In FIGS. 20 and 21, it is exemplified that a plurality of solar cells 10 manufactured from one mother solar cell includes a first cut cell 11 having a rectangular shape and a second cutting cell 12 having chamfered portions 1a at both edges of one side in a short axis direction. In this instance, it is exemplified that chamfered portions 1a of second cut cells 12, which are formed at both edges of opposite sides of one mother solar cell, are positioned at one side in FIGS. 20 and 21. This, first and second cut cells 11 and 12 positioned on one side of the mother solar cell are positioned as they are and first and second cut cells 11 and 12 positioned on the other side are positioned to be rotated 180 degrees. Therefore, a shape of a half of a single mother cell may be repeated. For example, when one mother solar cell is cut into six solar cells 10, two first cut cells 11 and one second cut cell 12 in which chamfered portions 1a are positioned may be repeatedly positioned. Accordingly, the first cutting cell 11 may be positioned at one end of the solar cell string 102 and the second cutting cell 12 may be positioned at the other end of the solar cell string 102. Accordingly, an appearance of the solar cell panel 100 can be improved, but embodiments of the invention are not limited thereto. Therefore, as shown in FIGS. 2 and 12, solar cells 10 may be arranged and connected so as to maintain a shape of a mother solar cell. Alternatively, as shown in FIG. 25, a solar cell string 102 or a solar cell group 103 may be formed of only first cut cells 11. Alternatively, a solar cell string 102 or a solar cell group 103 may be formed of only second cut cells 12. In this instance, a position or the like of the chamfered portion 1a may be variously modified.

A shape, an arrangement, or the like of the plurality of solar cells 10 forming the solar cell string 102 or the solar cell group 103 may be variously modified, and embodiments of the invention are not limited thereto.

Further, a structure of the intermediate interconnector member 107 may be variously modified. Hereinafter, various embodiments of the intermediate interconnector member 107 will be described in detail with reference to FIGS. 26 to 28.

Figure 26:
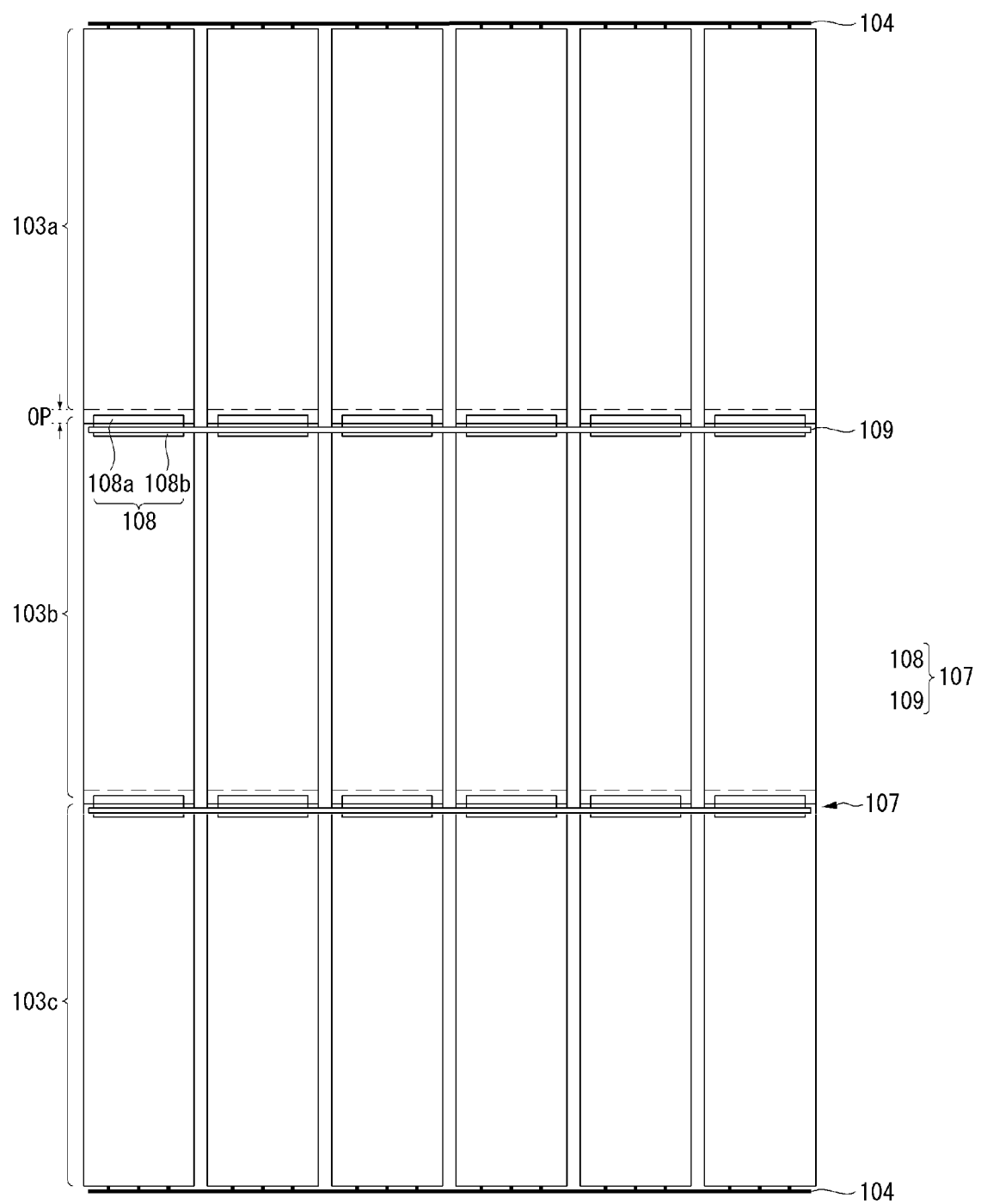
FIG. 26 is a plan view showing a plurality of solar cell groups and intermediate interconnector members included in a solar cell panel according to still yet another embodiment of the invention.

FIG. 26 is a plan view showing a plurality of solar cell groups and intermediate interconnector member included in a solar cell panel according to still yet another embodiment of the invention.

Referring to FIG. 26, in the embodiment, a first member 108 of an intermediate interconnector member 107 may have a rectangular shape having a relatively small width in a first direction and longitudinally extending in a second direction. A portion of the first member 108 disposed on an overlap area OP forms an overlapped portion 108a and a portion of the first member 108 disposed outside the overlap area OP forms an outer portion 108b. The first member 108 having such a structure can improve a connection property and reduce a contact resistance between the first member 108 and the second member 109 by increasing an area of the outer portion 108b to which the first member 108 is connected.

Figure 27:
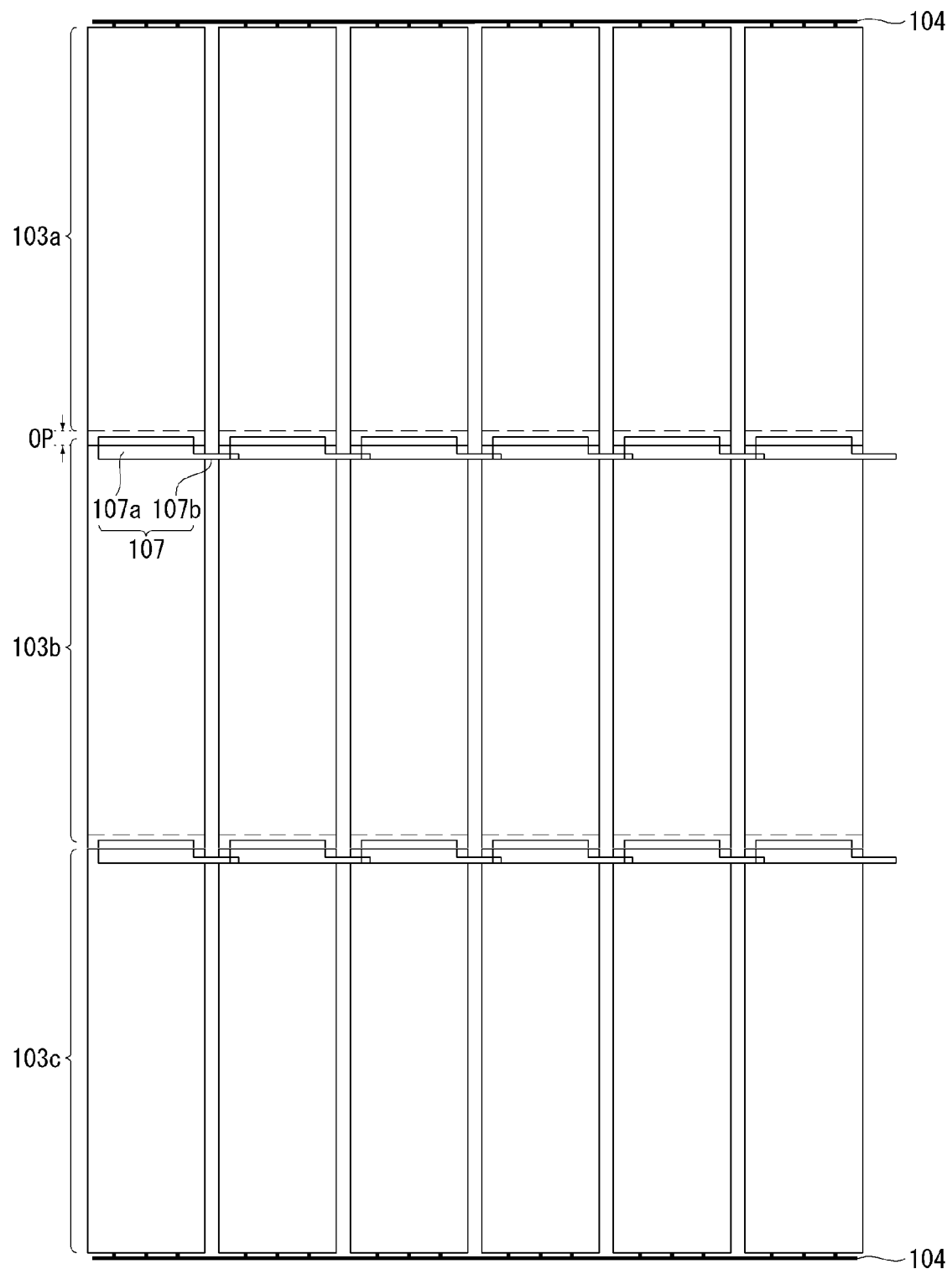
FIG. 27 is a plan view showing a plurality of solar cell groups and intermediate interconnector members included in a solar cell panel according to still yet another embodiment of the invention.

FIG. 27 is a plan view showing a plurality of solar cell groups and intermediate interconnector members included in a solar cell panel according to still yet another embodiment of the invention.

Referring to FIG. 27, in the embodiment, an intermediate interconnector member 107 includes an overlapped portion 107a and an outer portion 107b. In the embodiment, the outer portion 107b may be formed to extend from the overlapped portion 107a and extend to an outside (e.g., an outside at one side) of the solar cell string 102. Each intermediate interconnector member 107 having an overlapped portion 107a and an outer portion 107b is positioned to correspond to each solar cell string 102, and a plurality of intermediate interconnector members 107 each having an overlapped portion 107a and an outer portion 107b are positioned to correspond to a plurality of solar cell strings 102, respectively.

In this instance, the solar cell strings 102 neighboring in a second direction may be electrically and physically connected to each other by overlapping an outer portion 107b of one intermediate interconnector member 107 provided in one solar cell string 102 with an outer portion 107b of another intermediate interconnector member 107 provided in another solar cell string 102 adjacent to one side of the one solar cell string 102. This connection is repeated so that a plurality of solar cell strings 102 are connected. In the embodiment, the intermediate interconnector member 107 has the overlapped portion 107a and the outer portion 107b. Thus, in the embodiment, a second member 109 (see FIG. 21) for connecting a plurality of first members of a plurality of solar cell strings 102 is not provided. However, embodiments of the invention are not limited thereto, and a second member 109 connected to the plurality of outer portions 107b may be additionally provided. Various other modifications are possible.

The intermediate interconnector members 107 of the neighboring solar cell strings 102 may be connected by soldering, an electrical conductive adhesive, or the like. A manufacturing process can be simplified by joining the intermediate interconnector members 107 of the neighboring solar cell strings 102 by soldering.

Figure 28:
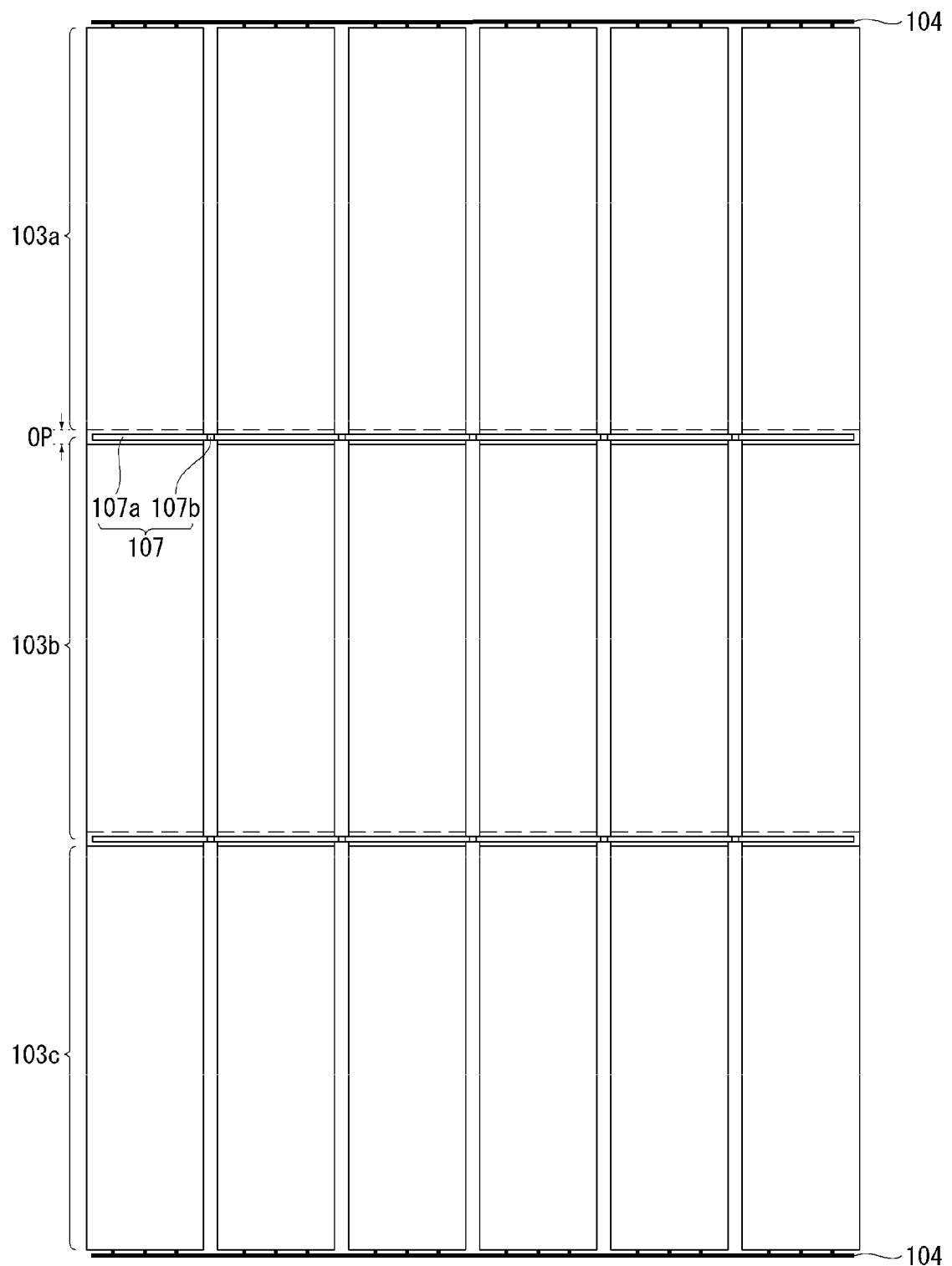
FIG. 28 is a plan view showing a plurality of solar cell groups and intermediate interconnector members included in a solar cell panel according to still yet another embodiment of the invention.

FIG. 28 is a plan view showing a plurality of solar cell groups and intermediate interconnector members included in a solar cell panel according to still yet another embodiment of the invention.

Referring to FIG. 28, in the embodiment, an intermediate interconnector member 107 may have a bar or straight shape longitudinally extending in a second direction. In this instance, a portion positioned at the overlap area OP forms an overlapped portion 107a and a portion extending in the second direction from the overlapped portion 107a and positioned between the adjacent solar cell strings 102 forms an outer portion 107b. Then, a plurality of solar cell strings 102 can be electrically and physically connected by one intermediate interconnector member 107. Accordingly, a structure can be simplified. Also, the intermediate interconnector member 107 is positioned so as not to be deviated from the overlap area OP in the first direction, a separate insulating layer 136 (see FIG. 22) may not be provided. Thus, a structure can be simplified.

The features, structures, effects and the like according to the above-described embodiments are included in at least one embodiment of the invention and are not necessarily limited to one embodiment. Further, the features, structures, effects and the like illustrated in the embodiments may be combined and modified by other persons skilled in the art to which the embodiments belong. Therefore, it is to be understood that embodiments of the invention are not limited to these embodiments.

What is claimed is:

1. A solar cell panel comprising:
a plurality of solar cells; and
a diode member connected to the plurality of solar cells, the diode member being formed of a solar cell unit disposed within the solar cell panel under at least a portion of one of the plurality of solar cells at a non-light-incident region,
wherein each of the plurality of solar cells comprises:
a semiconductor substrate,
a first conductive region forming a pn junction on a light-incident side of the semiconductor substrate,
a second conductive region opposite to the first conductive region on a non-light-incident side of the semiconductor substrate,
a first passivation layer on the first conductive region,
a second passivation layer on the second conductive region,
a first electrode connected to the first conductive region through an opening passing through the first passivation layer, and
a second electrode connected to the second conductive region through an opening passing through the second passivation layer,
wherein the diode member comprises:
a sub-semiconductor substrate,
a first sub-conductive region forming a pn junction on a light-incident side of the sub-semiconductor substrate, a second sub-conductive region opposite to the first sub-conductive region on a non-light-incident side of the sub-semiconductor substrate,
a first sub-passivation layer on the first sub-conductive region,
a second sub-conductive region on the second sub-conductive region,
a first sub-electrode connected to the first sub-conductive region through an opening passing through the sub-first passivation layer, and
a second sub-electrode connected to the second sub-conductive region through an opening passing through the second sub-passivation layer.

2. The solar cell panel of claim 1, wherein at least one of the plurality of solar cells and the diode member formed of the solar cell unit have the same lamination structure, or
wherein the diode member formed of the solar cell unit has an area that is the same as or smaller than an area of at least one of the plurality of solar cells.

3. The solar cell panel of claim 1, wherein the plurality of solar cells are connected in series to form a solar cell string, and
wherein the diode member is a block diode connected to the solar cell string.

4. The solar cell panel of claim 3, wherein the solar cell panel comprises a plurality of solar cell strings connected in parallel,
wherein the block diode comprises a plurality of block diodes disposed at one end of each of the plurality of solar cell strings, and
wherein the block diode is connected in series to an end solar cell disposed at the one end of the plurality of solar cells forming the solar cell string.

5. The solar cell panel of claim 3,
wherein the first conductive region of the at least one of the plurality of solar cells and the first sub-conductive region of the block diode are electrically connected to each other, and
wherein the second conductive region of the at least one of the plurality of solar cells and the second sub-conductive region of the block diode are electrically connected to each other.

6. The solar cell panel of claim 5, wherein an end solar cell disposed at one end of the plurality of solar cells forming the solar cell string and the block diode are spaced apart from each other, and
wherein the end solar cell and the block diode are connected to each other by a connecting member.

7. The solar cell panel of claim 6, wherein the first sub-conductive region of the block diode is disposed on or at a first surface of the block diode that is the same surface as a first surface of the end solar cell where a first conductive region having the first conductivity type of the end solar cell is disposed,
wherein the second sub-conductive region of the block diode is disposed on or at a second surface of the block diode that is the same surface as a second surface of the end solar cell where a second conductive region having the second conductivity type of the end solar cell is disposed, and
wherein the connecting member comprises a first connecting member for connecting the first conductive region of the end solar cell and the first sub-conductive region of the block diode on the first surface of the block diode and the first surface of the end solar cell, and a second connecting member for connecting the second conductive region of the end solar cell and the second sub-conductive region of the block diode on the second surface of the block diode and the second surface of the end solar cell.

8. The solar cell panel of claim 1, wherein the plurality of solar cells forms a solar cell string,
wherein the plurality of solar cells forms a plurality of solar cell groups, and
wherein the diode member is a bypass diode connected to at least one of the plurality of solar cell groups.

9. The solar cell panel of claim 8, wherein the plurality of solar cell groups comprises a first solar cell group and a second solar cell group connected in series to the first solar cell group, and
wherein the bypass diode includes a first bypass diode connected in parallel to the first solar cell group and a second bypass diode connected in parallel to the second solar cell group.

10. The solar cell panel of claim 8, further comprising:
an interconnector member electrically connected to the plurality of solar cell groups,
wherein the bypass diode is connected to the interconnector member through a connecting member.

11. The solar cell panel of claim 10,
wherein the interconnector member comprises:
a first interconnector member connected to the first conductive region of the at least one of the plurality of solar cells at one side of one of the plurality of solar cell groups, and
a second interconnector member connected to the second conductive region of another one of the plurality of solar cells at the other side of the one of the plurality of the solar cell groups, and
wherein the connecting member comprises:
a first connecting member for electrically connecting the first sub-conductive region of the bypass diode to the first interconnector member, and
a second connecting member for electrically connecting the second sub-conductive region of the bypass diode to the second interconnector member.

12. The solar cell panel of claim 8, wherein at least one of the plurality of solar cell groups comprises a plurality of solar cell strings connected in parallel to each other, and
wherein at least one of the plurality of solar cell strings comprises a plurality of solar cells connected in series to each other.

13. The solar cell panel of claim 1, wherein the plurality of solar cells and the diode member are connected to each other by a connecting member, and
wherein the diode member and at least a part of the connecting member are disposed on a back surface of the plurality of solar cells.

14. The solar cell panel of claim 1, wherein the plurality of solar cells comprise a first solar cell and a second solar cell adjacent to each other and each of the first and second solar cells having a long axis and a short axis, the first solar cell and the second solar cell having an overlap area where the first and second solar cells overlap each other, and an adhesive member disposed between the first and second solar cells at the overlap area to connect the first and second solar cells to each other; or
wherein the plurality of solar cells comprise two solar cells adjacent to each other, and the two solar cells are connected to each other by a ribbon or a wiring member extending from a first surface of one solar cell among the two solar cells to a second surface of the other solar cell among the two solar cells opposite to the first surface.

* * * * *